(12) United States Patent
Song et al.

(10) Patent No.: US 11,984,470 B2
(45) Date of Patent: May 14, 2024

(54) LIGHT-EMITTING DIODE AND DISPLAY DEVICE COMPRISING SAME

(71) Applicant: Samsung Display Co., LTD., Yongin-si (KR)

(72) Inventors: Keun Kyu Song, Seongnam-Si (KR);
Jung Hong Min, Pyeongtaek-Si (KR);
Dae Hyun Kim, Hwaseong-Si (KR);
Dong Uk Kim, Hwaseong-Si (KR);
Hyun Min Cho, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 482 days.

(21) Appl. No.: 17/423,290

(22) PCT Filed: Dec. 5, 2019

(86) PCT No.: PCT/KR2019/017138
§ 371 (c)(1),
(2) Date: Jul. 15, 2021

(87) PCT Pub. No.: WO2020/149529
PCT Pub. Date: Jul. 23, 2020

(65) Prior Publication Data
US 2022/0085097 A1 Mar. 17, 2022

(30) Foreign Application Priority Data
Jan. 15, 2019 (KR) .................. 10-2019-0005203

(51) Int. Cl.
*H01L 33/00* (2010.01)
*H01L 27/15* (2006.01)
(Continued)

(52) U.S. Cl.
CPC ........ *H01L 27/156* (2013.01); *H01L 33/0066* (2013.01); *H01L 33/0093* (2020.05);
(Continued)

(58) Field of Classification Search
CPC ............... H01L 27/156; H01L 33/0066; H01L 33/0093; H01L 33/24; H01L 33/30;
(Continued)

(56) References Cited

U.S. PATENT DOCUMENTS

| 8,933,432 B2 | 1/2015 | Ishizaki |
| 2002/0098606 A1 | 7/2002 | Nakamura et al. |

(Continued)

FOREIGN PATENT DOCUMENTS

| CN | 1160937 | 10/1997 |
| CN | 107610602 | 1/2018 |

(Continued)

OTHER PUBLICATIONS

Extended European Search Report for European Patent Application or Patent No. 19910491.0, dated Oct. 7, 2022.
(Continued)

*Primary Examiner* — Elias Ullah
(74) *Attorney, Agent, or Firm* — KILE PARK REED & HOUTTEMAN PLLC

(57) ABSTRACT

A light-emitting diode includes a first semiconductor region having a first conductive type; a second semiconductor region having a second conductive type; and an active layer disposed between the first semiconductor region and the second semiconductor region and including phosphorus (P). The light-emitting diode has a rod shape, the second semiconductor region includes a first semiconductor layer, a second semiconductor layer, and a third semiconductor layer, which are sequentially stacked, the first semiconductor layer is disposed between the active layer and the second semiconductor layer, and the second semiconductor layer includes a compound represented by AlGaInP and satisfying Equation 1.

20 Claims, 24 Drawing Sheets

(51) Int. Cl.
  *H01L 33/24* (2010.01)
  *H01L 33/30* (2010.01)
  *H01L 33/38* (2010.01)
  *H01L 33/44* (2010.01)

(52) U.S. Cl.
  CPC .............. *H01L 33/24* (2013.01); *H01L 33/30* (2013.01); *H01L 33/38* (2013.01); *H01L 33/44* (2013.01); *H01L 2933/0025* (2013.01)

(58) Field of Classification Search
  CPC . H01L 33/38; H01L 33/44; H01L 2933/0025; H01L 33/12; H01L 33/305; H01L 33/20; H01L 25/0753; H01L 25/167; H01L 33/0008; H01L 33/36; H01L 33/62
  See application file for complete search history.

(56) References Cited

U.S. PATENT DOCUMENTS

| | | |
|---|---|---|
| 2013/0146906 A1 | 6/2013 | Kim |
| 2016/0211406 A1 | 7/2016 | Herner |
| 2018/0012876 A1 | 1/2018 | Kim et al. |
| 2018/0033912 A1 | 2/2018 | Bhusal et al. |
| 2018/0114878 A1 | 4/2018 | Danesh et al. |

FOREIGN PATENT DOCUMENTS

| | | |
|---|---|---|
| JP | 2012-142361 | 7/2012 |
| KR | 2000-0074448 | 12/2000 |
| KR | 10-2013-0058444 | 6/2013 |
| KR | 10-1436123 | 11/2014 |
| KR | 10-2015-0103661 | 9/2015 |
| KR | 10-2016-0024439 | 3/2016 |
| KR | 10-1782079 | 9/2017 |
| KR | 10-2018-0007025 | 1/2018 |
| KR | 10-2018-0009014 | 1/2018 |
| WO | 2016208993 | 12/2016 |

OTHER PUBLICATIONS

Juh-Yuh Su et al., "Improved 634 nm MQW AlGaInP LEDs Performance With Novel Tensile Strain Barrier Reducing Layer", IEEE Transactions On Electron Devices, Dec. 2003, pp. 2388-2392, vol. 50, No. 12.

International Search Report, with English translation, corresponding to International Application No. PCT/ KR2019/017138 dated Mar. 19, 2020.

Written Opinion, with English translation, corresponding to International Application No. PCT/KR2019/017138, dated Mar. 19, 2020.

LIGHT-EMITTING DIODE AND DISPLAY DEVICE COMPRISING SAME

CROSS-REFERENCE TO RELATED APPLICATION(S)

This application is a national entry of International Application No. PCT/KR2019/017138, filed on Dec. 5, 2019, which claims under 35 U.S.C. §§ 119(a) and 365(b) priority to and benefits of Korean Patent Application No. 10-2019-0005203, filed on Jan. 15, 2019 in the Korean Intellectual Property Office (KIPO), the entire contents of which are incorporated herein by reference.

BACKGROUND

1. Technical Field

The disclosure relates to a light-emitting diode and a display device including the same.

2. Description of Related Art

With the development of multimedia, display devices are becoming increasingly important. Accordingly, various types of display devices such as an organic light-emitting display (OLED) device, a liquid crystal display (LCD) device, and the like are being used.

A display device is a device for displaying an image and includes a display panel such as an organic light emitting display panel or a liquid crystal display panel. Among these, a light-emitting diode may be included as a light-emitting display panel. For example, a light-emitting diode (LED) may include an organic light-emitting diode (OLED) using an organic material as a fluorescent material, an inorganic light-emitting diode using an inorganic material as the fluorescent material, or the like.

The inorganic light-emitting diode using an inorganic semiconductor as the fluorescent material has durability even in a high-temperature environment and has higher blue light efficiency than the OLED. In addition, a transfer method using a dielectrophoresis (DEP) method has been developed for a manufacturing process, which has been pointed out as a limitation of existing inorganic light-emitting diodes. Accordingly, research is being continuously conducted on inorganic light-emitting diodes having superior durability and efficiency compared to OLEDs.

SUMMARY

The disclosure is directed to providing a light-emitting diode in which a lattice constant difference between a plurality of semiconductor layers is reduced as a light-emitting diode that emits red light.

In addition, the disclosure is directed to providing a display device in which defects formed in the semiconductor layer including the light-emitting diode are minimized and thus the quality of the light-emitting diode is improved.

It should be noted that objects of the disclosure are not limited to the above-described objects, and other objects of the disclosure will be apparent to those skilled in the art from the following descriptions.

According to an embodiment of the disclosure, a light-emitting diode may include a first semiconductor region having a first conductive type, a second semiconductor region having a second conductive type, and an active layer disposed between the first semiconductor region and the second semiconductor region and including phosphorus (P). The light-emitting diode may have a rod shape, the second semiconductor region may include a first semiconductor layer, a second semiconductor layer, and a third semiconductor layer which are sequentially stacked, the first semiconductor layer may be disposed between the active layer and the second semiconductor layer, and the second semiconductor layer may include a compound represented by Chemical Formula 1 and satisfying Equation 1, AlGaInP,    Chemical Formula 1

Equation 1:
$\frac{1}{5} \leq M \leq 9$, wherein M refers to a content of aluminum (Al) with respect to a content of gallium (Ga) included in AlGaInP (i.e., the content of aluminum (Al) in AlGaInP (at. %)/the content of gallium (Ga) in AlGaInP (at. %)).

The second semiconductor layer may include a first sub-semiconductor layer and a second sub-semiconductor layer disposed on the first sub-semiconductor layer, and M1 which is an M value of the first sub-semiconductor layer may be greater than M2 which is an M value of the second sub-semiconductor layer.

A lattice constant of the first sub-semiconductor layer may be greater than a lattice constant of the second sub-semiconductor layer.

The first sub-semiconductor layer and the second sub-semiconductor layer each may have a lattice constant in a range of about 5.45 Å to about 5.65 Å.

The second semiconductor layer may include a third sub-semiconductor layer disposed on the second sub-semiconductor layer and having an M value in Equation 1 equal to M3, and a difference between M1 and M2 may be equal to a difference between M2 and M3.

The difference between M1 and M2 may be in a range of about 0.2 to about 0.4.

M values in the second semiconductor layer may decrease from a surface contacting the first semiconductor layer toward another surface contacting the third semiconductor layer.

A length measured in a first direction, in which the first semiconductor region, the active layer, and the second semiconductor region are disposed, may be in a range of about 3 μm to about 5 μm in the light-emitting diode, and a length measured in the first direction may be in a range of about 10 nm to about 30 nm in the second semiconductor layer.

A length measured in the first direction may be in a range of about 5 nm to about 10 nm in each of the first sub-semiconductor layer and the second sub-semiconductor layer.

The active layer may include AlInP and AlGaInP and emit light having a center wavelength band in a range of about 500 nm to about 640 nm.

The second semiconductor layer may have a band gap energy in a range of about 2.0 eV to about 2.33 eV.

The first conductive type may be an n-type, and the second conductive type may be a p-type.

The light-emitting diode may comprise an insulating film surrounding at least an outer surface of the active layer. The insulating film may extend in a direction in which the first semiconductor region and the second semiconductor region are disposed.

The light-emitting diode may comprise a first electrode layer disposed on a surface of the first semiconductor region other than a surface of the first semiconductor region on which the active layer is disposed, of the first semiconductor region, and a second electrode layer disposed on the second semiconductor region.

According to an embodiment of the disclosure, a display device may comprise a base layer, a first electrode and a second electrode disposed on the base layer, and at least one first light-emitting diode disposed between the first electrode and the second electrode. The at least one first light-emitting diode may include a first semiconductor region having a first conductive type, a second semiconductor region having a second conductive type, and a first active layer disposed between the first semiconductor region and the second semiconductor region and including phosphorus (P), the second semiconductor region may include a first semiconductor layer, a second semiconductor layer, and a third semiconductor layer, which are sequentially stacked, the first semiconductor layer may be disposed between the active layer and the second semiconductor layer, and the second semiconductor layer may include a compound represented by Chemical Formula 1 and satisfying Equation 1, AlGaInP, Chemical Formula 1

Equation 1:

$1/9 \leq M \leq 9$, wherein M refers to a content of aluminum (Al) with respect to a content of gallium (Ga) included in AlGaInP (i.e., the content of aluminum (Al) in AlGaInP (at. %)/the content of gallium (Ga) in AlGaInP (at. %)).

The second semiconductor layer may include a first sub-semiconductor layer, and a second sub-semiconductor layer disposed on the first sub-semiconductor layer, and an M value of the first sub-semiconductor layer may be greater than an M value of the second sub-semiconductor layer.

A lattice constant of the first sub-semiconductor layer may be greater than a lattice constant of the second sub-semiconductor layer.

The display device may further comprise a third electrode and a fourth electrode disposed on the base layer, and at least one second light-emitting diode disposed between the third electrode and the fourth electrode. The second light-emitting diode may include a second active layer including nitrogen (N).

The at least one first light-emitting diode may emit a first light having a center wavelength band in a range of about 500 nm to about 640 nm, and the second light-emitting diode may emit a second light having a center wavelength band in a range of about 400 nm to about 450 nm.

End portions of the at least one first light-emitting diode may be electrically connected to the first electrode and the second electrode, respectively, and both end portions of the second light-emitting diode may be electrically connected to the third electrode and the fourth electrode, respectively.

The details of other embodiments are included in the detailed description and the accompanying drawings.

A light-emitting diode according to an embodiment is a light-emitting diode that emits red light and can include a semiconductor layer that reduces a lattice constant difference between semiconductor layers. Accordingly, the manufactured light-emitting diode can minimize defects that may be formed in the semiconductor layer.

In addition, a display device according to an embodiment can improve the quality of red light emitted by including the light-emitting diode.

The effects according to the embodiments are not limited by the contents exemplified above, and more various effects are included in this disclosure.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the disclosure will be described with reference to the accompanying drawings.

Figure 1:
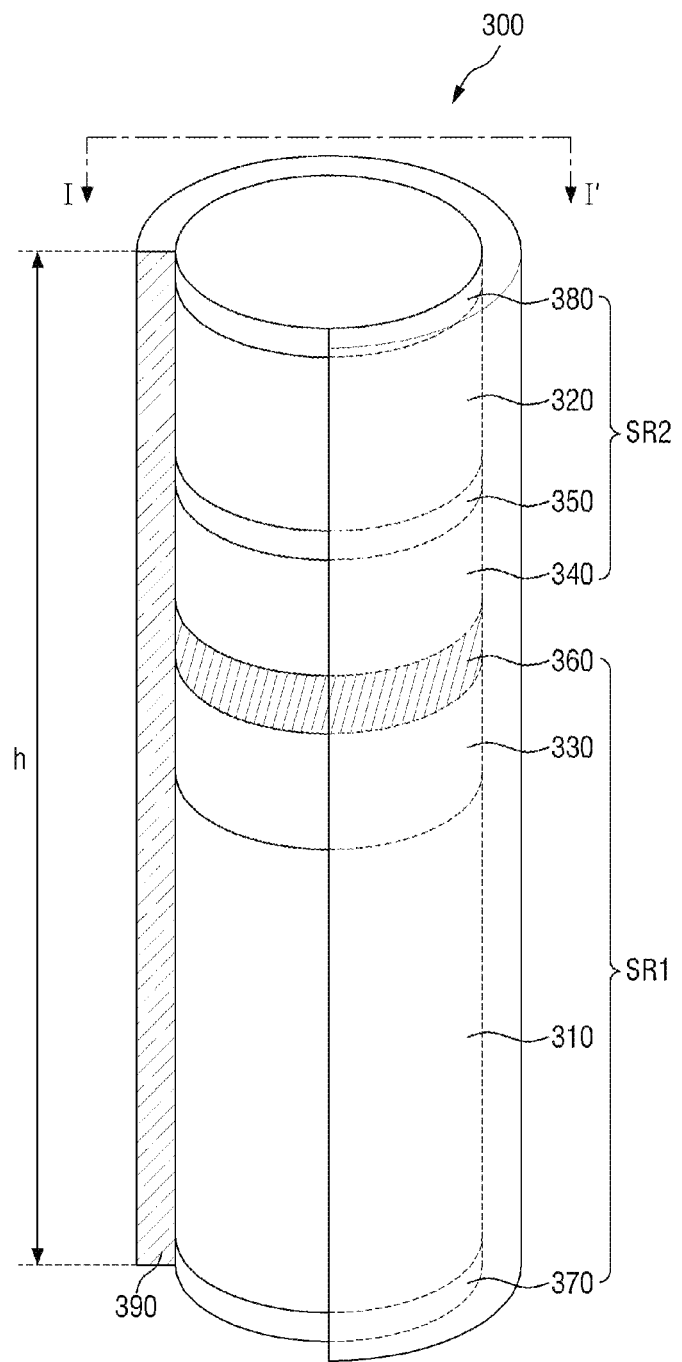
FIG. 1 is a schematic perspective view of a light-emitting diode according to an embodiment.
Figure 2:
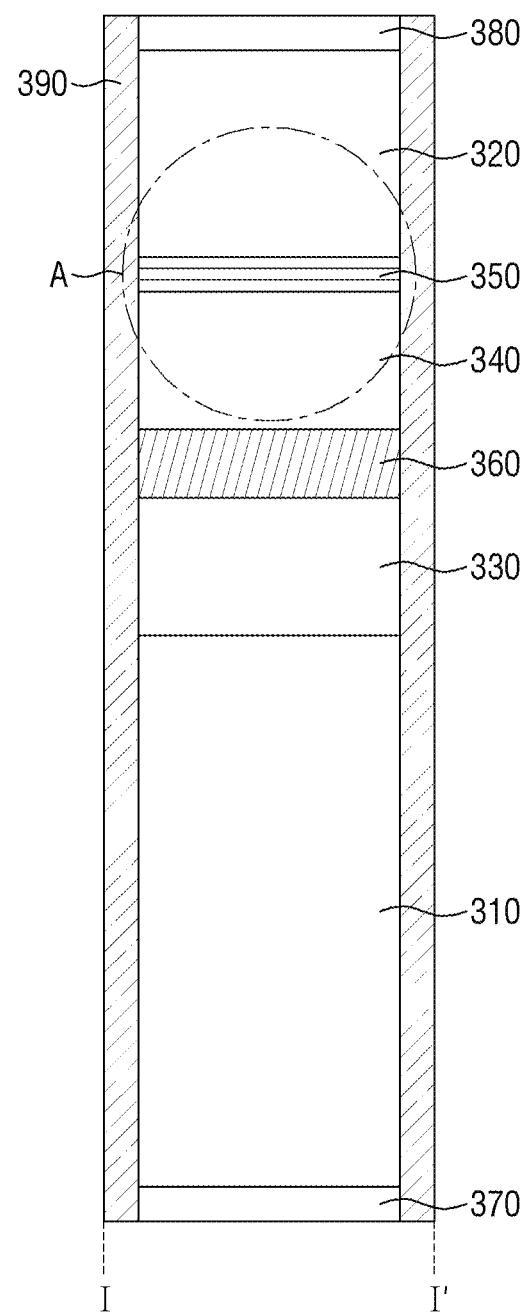
FIG. 2 is a schematic cross-sectional view taken along line I-I' of FIG. 1.

FIG. 1 is a schematic perspective view of a light-emitting diode according to an embodiment. FIG. 2 is a schematic cross-sectional view taken along line I-I' of FIG. 1.

A light-emitting diode 300 may be a light-emitting diode, and specifically, the light-emitting diode 300 has a size of a micrometer scale or a nanometer scale and may be an inorganic light-emitting diode made of (or including) an inorganic material. In case that the light-emitting diode 300 is the inorganic light-emitting diode, if an electric field is formed in a specific direction between two electrodes facing each other, the inorganic light-emitting diode may be aligned between the two electrodes in which polarity is formed. The light-emitting diode 300 may receive a predetermined electrical signal from an electrode to emit light in a specific wavelength band.

The light-emitting diode 300 may include semiconductor crystals doped with an arbitrary conductive type (e.g., p-type or n-type) impurity. The semiconductor crystals may receive an electrical signal applied from an external power source to emit light in a specific wavelength band.

Referring to FIGS. 1 and 2, the light-emitting diode 300 according to an embodiment may include a first semiconductor region SR1, a second semiconductor region SR2, and an active layer 360 disposed between the first and second conductor regions. More specifically, the light-emitting diode 300 may include a first semiconductor 310, a second semiconductor 320, a third semiconductor 330, a fourth semiconductor 340, a fifth semiconductor 350, an active layer 360, and an insulating film 390. The light-emitting diode 300 according to an embodiment may further include at least one conductive electrode layer 370 or 380. FIGS. 1 and 2 illustrate that the light-emitting diode 300 further includes a first conductive electrode layer 370 and a second conductive electrode layer 380, but the embodiment is not limited thereto. In some embodiments, in the light-emitting diode 300, at least one of the first conductive electrode layer 370 and the second conductive electrode layer 380 may be omitted. The description of the light-emitting diode 300 that is to be described below may be similarly applied even in case that the number of conductive electrode layers 370 and 380 is different or other structures are further included.

In the specification, the terms "first," "second," and the like are used to refer to each component, but these terms are only used to distinguish the components and do not necessarily refer to the corresponding component. For example, the components defined as first, second, and the like are not necessarily limited to a specific structure or position, and different ordinal numbers may be assigned in some cases. Therefore, the number assigned to each component may be described through drawings and the following description, and it goes without saying that the "first" component mentioned below may be a "second" component within the technical spirit of the disclosure.

The light-emitting diode 300 may extend in a direction. The light-emitting diode 300 may have a shape such as a nanorod, a nanowire, a nanotube, or the like. In an embodiment, the light-emitting diode 300 may have a cylindrical shape or a rod shape. However, the shape of the light-emitting diode 300 is not limited thereto, and the light-emitting diode 300 may have various shapes such as a cubic, a rectangular parallelepiped, and a hexagonal columnar shape. Semiconductors included in the light-emitting diode 300 described below may have a structure which the semiconductors are sequentially disposed or stacked in the direction.

The light-emitting diode 300 according to an embodiment may include at least one semiconductor layer in which the active layer 360 contains phosphorus (P). As will be described below, the active layer 360 of the light-emitting diode 300 may include a semiconductor layer containing phosphorus (P) to emit light in a specific wavelength band. In an embodiment, the light emitted from the active layer 360 may be red light having a central wavelength range of about 620 nm to about 750 nm. However, it should be understood that the central wavelength range of red light is not limited to the above-described range and includes all wavelength ranges that may be recognized as red in the art.

The light-emitting diode 300 may be a light-emitting diode that emits red light, and the active layer 360 and other semiconductors included in the light-emitting diode 300 may each include a semiconductor material containing at least phosphorus (P). However, the embodiment is not limited thereto.

In case that the light-emitting diode 300 is specifically described with reference to FIGS. 1 and 2, the first semiconductor 310 may be, for example, an n-type semiconductor having a first conductive type. For example, in case that the light-emitting diode 300 emits light in a red wavelength band, the first semiconductor 310 may contain a semiconductor material having a chemical formula of $In_xAl_yGa_{1-x-y}P$ ($0 \leq x \leq 1$, $0 \leq y \leq 1$, and $0 \leq x+y \leq 1$). For example, the semiconductor material may include one or more of InAlGaP, GaP, AlGaP, InGaP, AlP, and InP doped with an n-type dopant. The first semiconductor 310 may be doped with a first conductive type dopant, and as an example, the first conductive type dopant may include Si, Ge, Sn, or the like. In an embodiment, the first semiconductor 310 may be n-AlGaInP doped with Si, which is an n-type dopant. A length of the first semiconductor 310 may range from about 1.5 μm to about 5 μm, but the embodiment is not limited thereto.

The second semiconductor 320 is disposed on the fifth semiconductor 350 to be described below. The second semiconductor 320 may be a p-type semiconductor having a second conductive type, and as an example, in case that the light-emitting diode 300 emits light in a red wavelength band, the second semiconductor 320 may contain a semiconductor material having a chemical formula of $In_xAl_yGa_{1-x-y}P$ ($0 \leq x \leq 1$, $0 \leq y \leq 1$, and $0 \leq x+y \leq 1$). For example, the semiconductor material may include one or more of InAlGaP, GaP, AlGaNP, InGaP, AlP, and InP doped with a p-type dopant. The second semiconductor 320 may be doped with a second conductive type dopant, and as an example, the second conductive type dopant may include Mg, Zn, Ca, Se, Ba, or the like. In an embodiment, the second semiconductor 320 may be p-GaP doped with Mg, which is a p-type dopant. A length of the second semiconductor 320 may range from about 0.08 μm to about 0.25 μm, but the embodiment is not limited thereto.

The drawing illustrates that the first semiconductor 310 and the second semiconductor 320 are configured (or formed) as one layer, but the embodiment is not limited thereto. In some embodiments, the first semiconductor 310 and the second semiconductor 320 may include a greater number of layers depending on the material of the active layer 360.

The light-emitting diode 300 may include a clad layer disposed adjacent to the active layer 360 to be described below. As shown in the drawing, the third semiconductor 330 and the fourth semiconductor 340 respectively disposed on and under the active layer 360 may be clad layers.

The third semiconductor 330 may be disposed on the first semiconductor 310 and may be an n-type semiconductor similar to the first semiconductor 310. As an example, the third semiconductor 330 may contain a semiconductor material having a chemical formula of $In_xAl_yGa_{1-x-y}P$ (0≤x≤1, 0≤y≤1, and 0≤x+y≤1). In an embodiment, the first semiconductor 310 may be n-AlGaInP, and the third semiconductor 330 may be n-AlInP. However, the embodiment is not limited thereto.

The active layer 360 is disposed on the third semiconductor 330. The active layer 360 may contain a material having a single or multiple quantum well structure. In case that the active layer 360 contains a material having the multiple quantum well structure, it may have a structure in which quantum layers and well layers are alternately stacked on each other. The active layer 360 may emit light by combination of electron-hole pairs according to electrical signals applied through the first semiconductor 310 and the second semiconductor 320. As an example, in case that the active layer 360 emits light in a red wavelength band, it may contain a material such as AlGaP or AlInGaP. In particular, in case that the active layer 360 has a multiple quantum well structure in which quantum layers and well layers are alternately stacked, the quantum layer may contain a material such as AlGaP or AlInGaP, and the well layer may contain a material such as GaP or AlInP. In an embodiment, as described above, the active layer 360 may contain AlGaInP as the quantum layer and AlInP as the well layer so that the active layer 360 emits red light having a central wavelength band of about 620 nm to about 750 nm.

However, the embodiment is not limited thereto, and the active layer 360 may have a structure in which semiconductor materials having large band gap energy and semiconductor materials having small band gap energy are alternately stacked on each other, and may contain different Group III or V semiconductor materials depending on a wavelength band of emitted light. The light emitted from the active layer 360 is not limited to light in the red wavelength band but may also be light in the blue or green wavelength band in some embodiments. A length of the active layer 360 may range from about 0.05 μm to about 0.25 μm, but the embodiment is not limited thereto.

The light emitted from the active layer 360 may be emitted not only to an outer surface of the light emitting diode 300 in a longitudinal direction but also to both side surfaces. The direction of the light emitted from the active layer 360 is not limited to one direction.

The fourth semiconductor 340 is disposed on the active layer 360. The fourth semiconductor 340 may be a clad layer, similar to the third semiconductor 330, and may be a p-type semiconductor, similar to the second semiconductor 320. As an example, the fourth semiconductor 340 may contain a semiconductor material having a chemical formula of $In_xAl_yGa_{1-x-y}P$ (0≤x≤1, 0≤y≤1, and 0≤x+y≤1). In an embodiment, the second semiconductor 320 may be p-GaP, and the fourth semiconductor 340 may be p-AlInP.

The fifth semiconductor 350 is disposed on the fourth semiconductor 340. The fifth semiconductor 350 may be a semiconductor doped with a p-type dopant, similar to the second and fourth semiconductors 320 and 340. The fifth semiconductor 350 may perform a function of reducing a lattice constant difference between the fourth semiconductor 340 and the second semiconductor 320.

A lattice constant difference between semiconductor crystals in the fourth semiconductor 340 and the second semiconductor 320 that are p-type doped semiconductors may be large. For example, in case that the fourth semiconductor 340 is p-AlInP and the second semiconductor 320 is p-GaP, a lattice constant of p-AlInP is about 5.65 Å, and a lattice constant of p-GaP is about 5.45 Å, which shows a large difference in values. In case that p-GaP is grown as the second semiconductor 320 directly on p-AlInP, which is the fourth semiconductor 340, a strong strain or stress acts between different semiconductor crystals, and lattice defects may occur because of lattice mismatch when manufacturing the light-emitting diode 300. In this case, the growth of the second semiconductor 320 on the fourth semiconductor 340 may not be smooth.

The light-emitting diode 300 includes the fifth semiconductor 350 disposed between the fourth semiconductor 340 and the second semiconductor 320 to reduce a lattice constant difference therebetween, thereby inducing a smooth growth of the second semiconductor 320. For example, the fifth semiconductor 350 may be a tensile strain barrier reducing (TSBR) layer.

According to an embodiment, the fifth semiconductor 350 may contain a compound represented by the following Chemical Formula 1. In Chemical Formula 1, x may include one or more sub-semiconductor layers different from each other.

AlGaInP,            Chemical Formula 1

(where, x satisfies about 0.1≤x≤about 0.9).

The fifth semiconductor 350 may include elements contained in the fourth semiconductor 340 and the second semiconductor 320. In an embodiment, the fifth semiconductor 350 may include aluminum (Al), indium (In), and phosphorus (P) contained in the fourth semiconductor 340, and gallium (Ga) and phosphorus (P) contained in the second semiconductor 320. In Chemical Formula 1, x refers to a relative atomic ratio between aluminum (Al) and gallium (Ga). For example, in case that x is about 0.3, Chemical Formula 1 may be represented as $Al_{0.3}Ga_{0.7}InP$. Here, the relative atomic ratio of Al and Ga refers to about 0.3:0.7, and the atomic ratio does not refer to an atomic ratio in AlGaInP. For example, it can be understood that Chemical Formula 1 has an atomic ratio of $(Al-Ga)_{0.25}In_{0.25}P_{0.5}$.

For example, in an embodiment, the fifth semiconductor 350 may be represented by Chemical Formula 1, for example, AlGaInP, and may satisfy the following Equation 1.

1/9≤M≤9,            Equation 1 where M refers to a content of aluminum (Al) with respect to a content of gallium (Ga) contained in AlGaInP [(the content of aluminum (Al) in AlGaInP (at. %)/the content of gallium (Ga) in AlGaInP (at. %)].

In Chemical Formulas 1 and Equation 1, a content ratio (Al:Ga) of aluminum (Al) and gallium (Ga) in the compound represented as AlGaInP may range from about 1:9 to about 9:1.

In the fifth semiconductor 350, since x ranges from about 0.1 to about 0.9 in Chemical Formula 1, each sub-semiconductor layer may simultaneously include aluminum (Al) and gallium (Ga). Each sub-semiconductor layer is distinguished from each other according to a value of x and may include different types of semiconductor crystals.

The fifth semiconductor 350 may contain a compound represented by Chemical Formula 1, and a lattice constant thereof may have a value between the lattice constants of the fourth semiconductor 340 and the second semiconductor 320. For example, in case that the fourth semiconductor 340 includes p-AlInP and has a lattice constant of about 5.65 Å, and the second semiconductor 320 includes p-GaP and has a lattice constant of about 5.45 Å, the lattice constant of the fifth semiconductor 350 may have a value of about 5.45 Å to about 5.65 Å. However, the embodiment is not limited thereto.

The fifth semiconductor 350 according to an embodiment may include sub-semiconductor layers having different x values in Chemical Formula 1. The sub-semiconductor layers may have different x or M values and may have different lattice constants. The fifth semiconductor 350 may include the sub-semiconductor layers between the fourth semiconductor 340 and the second semiconductor 320 to gradually reduce the lattice constant difference therebetween. The sub-semiconductor layer of the fifth semiconductor 350 will be described below in more detail with reference to other drawings.

The conductive electrode layers 370 and 380 may be ohmic contact electrodes. However, the embodiment is not limited thereto, and the conductive electrode layers 370 and 380 may also be Schottky contact electrodes. The conductive electrode layers 370 and 380 may include the first conductive electrode layer 370 disposed on another surface opposite to a surface, on which the third semiconductor 330 is disposed, and the second conductive electrode layer 380 disposed on the second semiconductor 320. However, the embodiment is not limited thereto, and at least one of the conductive electrode layers 370 and 380 may be omitted.

The conductive electrode layers 370 and 380 may contain a conductive metal. For example, the conductive electrode layers 370 and 380 may contain at least one of aluminum (Al), titanium (Ti), indium (In), gold (Au), silver (Ag), indium tin oxide (ITO), indium zinc oxide (IZO), and indium tin-zinc oxide (ITZO). The conductive electrode layers 370 and 380 may contain a semiconductor material doped with an n- or p-type dopant. For example, the first conductive electrode layer 370 may contain n-GaAs doped with an n-type dopant, and the second conductive electrode layer 380 may contain p-GaP doped with a p-type dopant. The conductive electrode layers 370 and 380 may contain the same material or different materials, but the embodiment is not limited thereto.

The insulating film 390 is disposed to surround outer surfaces of the semiconductors described above. In an embodiment, the insulating film 390 may be disposed to surround at least an outer surface of the active layer 360 and may extend in a direction in which the light-emitting diode 300 extends. The insulating film 390 may perform a function of protecting the members. As an example, the insulating film 390 may be formed to surround side surfaces of the members, and both end portions of the light-emitting diode 300 in the longitudinal direction may be formed to be exposed. However, the embodiment is not limited thereto.

The insulating film 390 may contain materials having insulating properties, for example, silicon oxide ($SiO_x$), silicon nitride ($SiN_x$), silicon oxynitride ($SiO_xN_y$), aluminum nitride (AlN), aluminum oxide ($Al_2O_3$), or the like. Accordingly, it is possible to prevent an electrical short circuit that may occur in case that the active layer 360 contacts an electrode through which an electrical signal is transmitted to the light-emitting diode 300. Since the insulating film 390 protects an outer surface of the light-emitting diode 300 including the active layer 360, it is possible to prevent a reduction in luminous efficiency.

The drawing illustrates that the insulating film 390 is formed to extend in the longitudinal direction of the light-emitting diode 300 so as to cover from the first semiconductor 310 to the conductive electrode layers 370 and 380, but the embodiment is not limited thereto. The insulating film 390 may cover only outer surfaces of some conductive semiconductors in addition to the active layer 360, or only some of outer surfaces of the conductive electrode layers 370 and 380 so that some outer surfaces of the conductive electrode layers 370 and 380 may be exposed.

A thickness of the insulating film 390 may range from about 0.5 μm to about 1.5 μm, but the embodiment is not limited thereto.

Further, in some embodiments, an outer surface of the insulating film 390 may be surface-treated. In case that a display device 1 is manufactured, the light-emitting diode 300 may be sprayed on an electrode while being dispersed in an ink to be aligned. Here, the surface of the insulating film 390 may be hydrophobically or hydrophilically treated in order to maintain the state in which the light-emitting diodes 300 are dispersed without being agglomerated with other adjacent light-emitting diodes 300 in the ink.

The light-emitting diode 300 may have a length h ranging from about 1 μm to about 10 μm or from about 2 μm to about 5 μm, or may have a length of about 4 μm. A diameter of the light-emitting diode 300 may range from about 300 nm to about 700 nm, and the light-emitting diodes 300 included in the display device 1 may have different diameters depending on a composition difference of the active layer 360. The diameter of the light-emitting diode 300 may be about 500 nm.

As described above, the light-emitting diode 300 according to an embodiment may include the fifth semiconductor 350 including sub-semiconductor layers.

Figure 3:
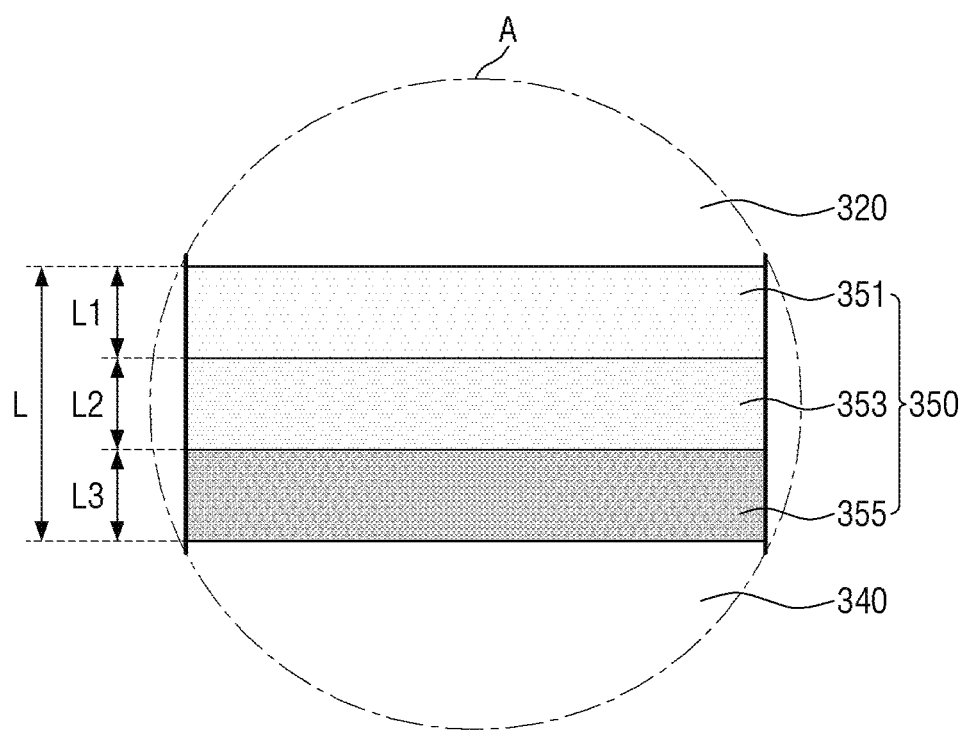
FIG. 3 is a schematic enlarged view of part A of FIG. 2.

FIG. 3 is a schematic enlarged view of part A of FIG. 2.

Referring to FIG. 3, the fifth semiconductor 350 may include sub-semiconductor layers, for example, a first sub-semiconductor layer 351, a second sub-semiconductor layer 353, and a third sub-semiconductor layer 355. The first sub-semiconductor layer 351 is disposed on the fourth semiconductor 340, the second sub-semiconductor layer 353 is disposed on the first sub-semiconductor layer 351, and the third sub-semiconductor layer 355 is disposed on the second sub-semiconductor layer 353. The second semiconductor 320 is disposed on the third sub-semiconductor layer 355.

As described above, the first to third sub-semiconductor layers 351, 353, and 355, each of which has the x values that are different from each other, contain the compound represented by Chemical Formula 1, and thus the M values may also be different values. According to an embodiment, the sub-semiconductor layers have the x values that are different from each other, but the difference in the x value and the difference in the M value between the sub-semiconductor layers may be constant. For example, the x value and the M value may be reduced stepwise between the sub-semiconductor layers 351, 353, and 355.

For example, in case that the fifth semiconductor 350 includes the first to third sub-semiconductor layers 351, 353, and 355 as shown in FIG. 3, the x values of the first to third sub-semiconductor layers 351, 353, and 355 may be about 0.7, about 0.5 and about 0.3, respectively. For example, the first sub-semiconductor layer 351 may be $Al_{0.7}Ga_{0.3}InP$, the second sub-semiconductor layer 353 may be $Al_{0.5}Ga_{0.5}InP$, and the third sub-semiconductor layer 355 may be $Al_{0.3}Ga_{0.7}InP$. In this case, the x value may decrease from the first sub-semiconductor layer 351 disposed on the fourth semiconductor 340 toward the third sub-semiconductor layer 355. An M1 value of the first sub-semiconductor layer 351 is about 7/3, an M2 value of the second sub-semiconductor layer 353 is about 1, and an M3 value of the third sub-semiconductor layer 355 is about 3/7. The M value of Equation 1 may decrease from the first sub-semiconductor layer 351 toward the third sub-semiconductor layer 355.

In the compound represented by Chemical Formula 1, as the x value increases or the M value increases, the content of the aluminum (Al) element in the sub-semiconductor layers 351, 353, and 355 increases. Since the lattice constant increases as the content of aluminum (Al) in the AlGaInP semiconductor crystal increases, a sub-semiconductor layer having a relatively large lattice constant may be disposed on the fourth semiconductor 340. Conversely, a sub-semiconductor layer having a relatively small lattice constant may be disposed adjacent to the second semiconductor 320.

Since the fifth semiconductor 350 includes the first to third sub-semiconductor layers 351, 353, and 355, the lattice constant difference between the second and fourth semiconductors 320 and 340 may be gradually reduced. Defects that may occur in crystal growth may be reduced because of lattice matching in the second semiconductor 320 grown in a subsequent process when manufacturing the light-emitting diode 300.

FIG. 3 illustrates that the fifth semiconductor 350 includes three sub-semiconductor layers, for example, the first to third sub-semiconductor layers 351, 353, and 355. However, the embodiment is not limited thereto, and the fifth semiconductor 350 may include a greater number of sub-semiconductor layers.

Figure 4:
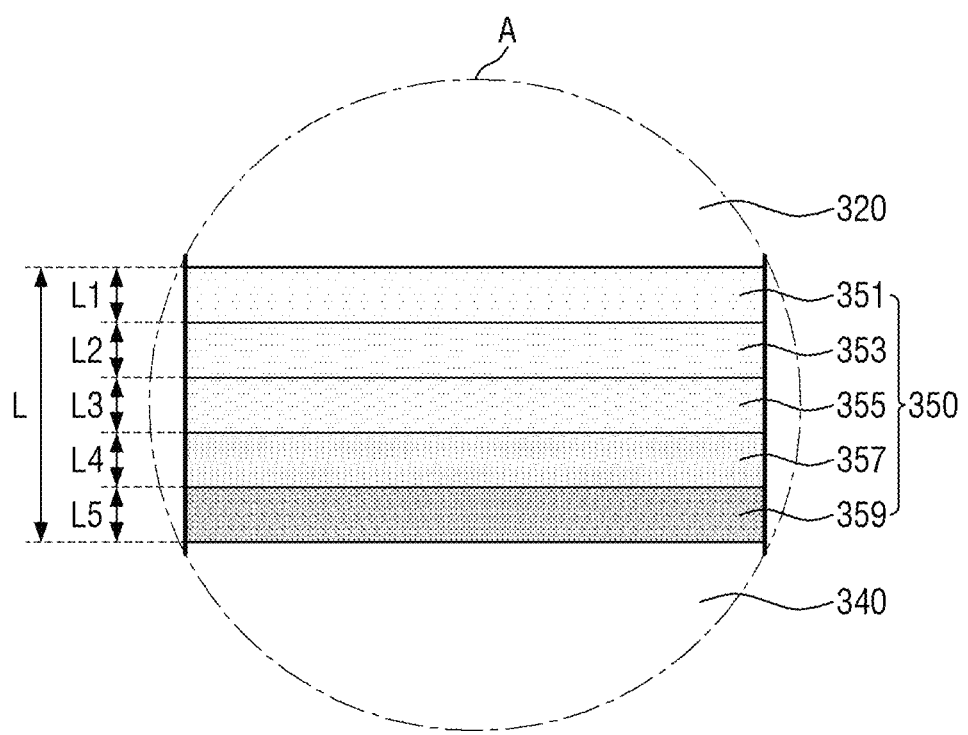
FIG. 4 is a schematic enlarged view of a fifth semiconductor according to another embodiment.

FIG. 4 is a schematic enlarged view of a fifth semiconductor according to an embodiment.

Referring to FIG. 4, the fifth semiconductor 350 may include first to fifth sub-semiconductor layers 351, 353, 355, 357, and 359. The first to fifth sub-semiconductor layers 351, 353, 355, 357, and 359 are sequentially stacked, and the first sub-semiconductor layer 351 may contact the second semiconductor 320, and the fifth sub-semiconductor layer 359 may contact the fourth semiconductor 340. The fourth semiconductor 340 may be disposed on the fifth sub-semiconductor layer 359 having a small lattice constant difference.

As an example, x values of the first to fifth sub-semiconductor layers 351, 353, 355, 357, and 359 may be about 0.9, about 0.7, about 0.5, about 0.3, and about 0.1, respectively. For example, the first sub-semiconductor layer 351 may be $Al_{0.9}Ga_{0.1}InP$, the second sub-semiconductor layer 353 may be $Al_{0.7}Ga_{0.3}InP$, the third sub-semiconductor layer 355 may be $A_{0.5}Ga_{0.5}InP$, the fourth sub-semiconductor layer 357 may be $Al_{0.3}Ga_{0.7}InP$, and the fifth sub-semiconductor layer 359 may be $Al_{0.1}Ga_{0.9}InP$. An M1 value of the first sub-semiconductor layer 351 is about 9, an M2 value of the second sub-semiconductor layer 353 is about 7/3, an M3 value of the third sub-semiconductor layer 355 is about 1, an M4 value is the fourth sub-semiconductor layer 357 is about 3/7, and an M5 value of the fifth sub-semiconductor layer 359 is about 1/9. For example, the M value of Equation 1 may decrease from the first sub-semiconductor layer 351 toward the fifth sub-semiconductor layer 359.

In this case, as a greater number of first to fifth sub-semiconductor layers 351, 353, 355, 357, and 359 are included, a lattice constant difference between the fourth semiconductor 340 and the first sub-semiconductor layer 351 and a lattice constant difference between the fifth sub-semiconductor layer 359 and the second semiconductors 320 may be further reduced.

The fifth semiconductor 350 may include a greater number of first to third sub-semiconductor layers 351, 353, and 355. However, thicknesses L1, L2, and L3 of the sub-semiconductor layers 351, 353, and 355 are the same as each other, and a thickness L of the fifth semiconductor 350 may be constant regardless of the number of the first to third sub-semiconductor layers 351, 353, and 355. According to an embodiment, the thickness L of the fifth semiconductor 350 may range from about 10 nm to about 30 nm, and each of the thicknesses L1, L2, and L3 of the sub-semiconductor layers 351, 353, and 355 may range from about 5 nm to about 10 nm.

For example, in case that the thickness L of the fifth semiconductor 350 is about 30 nm, each of the thicknesses L1, L2, and L3 of the first to third sub-semiconductor layers 351, 353, and 355 may be about 10 nm. In case that the thickness L of the fifth semiconductor 350 is about 10 nm, each of the thicknesses L1, L2, and L3 of the first to third sub-semiconductor layers 351, 353, and 355 may be about 3.3 nm. In case that the thickness L of the fifth semiconductor 350 is about 30 nm and includes a greater number of sub-semiconductor layers, for example, five sub-semiconductor layers, a thickness Ln of each sub-semiconductor layer may be equal to about 6 nm (where n is a natural number). However, the embodiment is not limited thereto, and as long as the thickness L of the fifth semiconductor 350 is constant within the range, and the thickness Ln of each sub-semiconductor layer is within a uniform range, it is not particularly limited.

Figure 5:
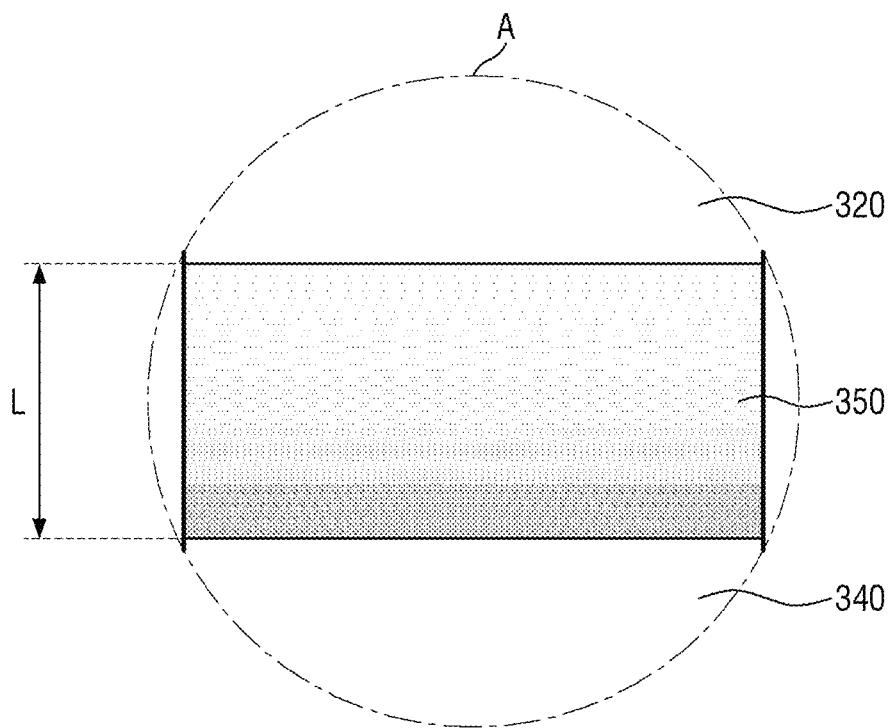
FIG. 5 is a schematic enlarged view of a fifth semiconductor according to still another embodiment.

FIG. 5 is a schematic enlarged view of a fifth semiconductor according to an embodiment.

The fifth semiconductor 350 according to the embodiment includes the compound represented by Chemical Formula 1, and the x value or the M value may decrease linearly in a direction in which the light-emitting diode 300 extends.

Referring to FIG. 5, the fifth semiconductor 350 according to an embodiment includes Chemical Formula 1, and the x value or the M value may change linearly. In an embodiment, in the sub-semiconductor layer of the fifth semiconductor 350, the x value of Chemical Formula 1 may decrease linearly from a surface of the fifth semiconductor 350 contacting the fourth semiconductor 340 toward another surface thereof contacting the second semiconductor 320.

The fifth semiconductor 350 of FIGS. 3 and 4 includes an arbitrary sub-semiconductor layer, and the sub-semiconductor layer may have a uniform x value in a certain region. In this case, the x value may change stepwise at a boundary between sub-semiconductor layers having different x values, and the lattice constant thereof may also change stepwise.

On the other hand, the fifth semiconductor 350 of FIG. 5 may include a sub-semiconductor layer in which the x value of Chemical Formula 1 linearly changes in a certain region. In this case, the x value in a certain region may change linearly, and the lattice constant may also change linearly. In an embodiment, the x value decreases linearly from a surface of the fifth semiconductor 350 contacting the fourth semiconductor 340 toward another surface thereof contacting the second semiconductor 320, and the lattice constant may also decrease linearly in the direction.

According to an embodiment, the fifth semiconductor 350 may have band gap energy in a range that does not absorb red light emitted from the active layer 360. In an embodiment, the fifth semiconductor 350 may have a band gap energy ranging from about 2.0 eV to about 2.33 eV.

As described above, in the light-emitting diode 300 according to an embodiment, red light is emitted from the active layer 360. The compound represented by Chemical Formula 1 may have band gap energy having a different range from that of light energy of the red light so that the red light emitted from the active layer 360 is not absorbed in the fifth semiconductor 350. For example, the fifth semiconductor 350 may reduce a lattice constant difference between the fourth semiconductor 340 and the second semiconductor 320, and simultaneously, may have band gap energy in a different numerical range from that of band gap energy of light emitted from the active layer 360. According to an embodiment, the light emitted from the active layer 360 may be transmitted through the fifth semiconductor 350 without being absorbed therein and may be emitted from the light-emitting diode 300.

The light-emitting diode 300 according to an embodiment may be manufactured on a substrate by an epitaxial growth method. The light-emitting diode 300 may be manufactured by a method of forming a seed crystal layer on the substrate and depositing an arbitrary semiconductor material to grow a semiconductor layer. In case that the light-emitting diode 300 grown on the substrate is separated from the substrate, the light-emitting diode 300 may be manufactured using a chemical lift off (CLO) method.

FIGS. 6 to 14 are schematic cross-sectional views illustrating a method of manufacturing a light-emitting diode according to an embodiment.

Figure 6:
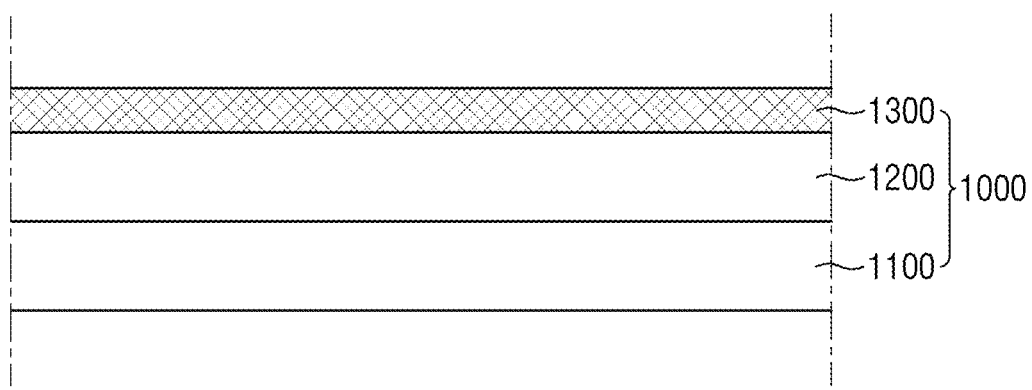
FIGS. 6 to 14 are schematic cross-sectional views illustrating a method of manufacturing a light-emitting diode according to an embodiment.

Referring to FIGS. 6 to 14, first, a lower substrate 1000 that includes a base substrate 1100, a buffer material layer (or buffer layer) 1200 formed on the base substrate 1100, and a separation layer 1300 formed on the buffer layer 1200 is prepared. As shown in FIG. 6, the lower substrate 1000 may have a structure in which the base substrate 1100, the buffer layer 1200, and the separation layer 1300 are sequentially stacked.

The base substrate 1100 may include a transparent substrate such as sapphire ($Al_2O_3$) and glass. However, the embodiment is not limited thereto, and the base substrate 1100 may be made of a conductive substrate such as GaN, SiC, ZnO, Si, GaP, and GaAs or may be made of a conductive material layer such as GaAs formed on the transparent substrate. Hereinafter, a case in which the base substrate 1100 is a GaAs substrate will be described as an example in order to manufacture the light-emitting diode 300 with reference to FIG. 1. A thickness of the base substrate 1100 is not particularly limited, but as an example, the base substrate 1100 may have a thickness ranging from about 400 μm to about 1500 μm.

As described below, conductive semiconductor layers are formed on the base substrate 1100. The conductive semiconductor layers grown by an epitaxial method may be grown by forming a seed crystal and depositing a crystal material thereon. Here, the conductive semiconductor layer may be formed by electron beam deposition, physical vapor deposition (PVD), chemical vapor deposition (CVD), plasma laser deposition (PLD), dual-type thermal evaporation, sputtering, metal-organic chemical vapor deposition (MOCVD), or the like and, preferably, metal-organic chemical vapor deposition (MOCVD). However, the embodiment is not limited thereto.

A precursor material for forming the conductive semiconductor layers is not particularly limited within a range that may be generally selected to form a target material. As an example, the precursor material may be a metal precursor including an alkyl group such as a methyl group or an ethyl group. For example, the precursor material may be a compound such as trimethyl gallium ($Ga(CH_3)_3$), trimethyl aluminum ($Al(CH_3)_3$), or triethyl phosphate ($(C_2H_5)_3PO_4$), but the embodiment is not limited thereto. Hereinafter, a method, process conditions, or the like for forming the conductive semiconductor layers will be omitted, and a procedure of the method of manufacturing the light-emitting diode 300 and a stacked structure will be described in detail.

The buffer layer 1200 is formed on the base substrate 1100. The drawing illustrates that the buffer layer 1200 is stacked as a single layer, but the embodiment is not limited thereto, and layers may be formed.

As an example, the buffer layer 1200 may include an undoped semiconductor, the buffer layer 1200 and a first semiconductor layer 3100 may include substantially a same material, and the buffer layer 1200 may contain a material that is not doped with an n-type or p-type dopant. In an embodiment, the buffer layer 1200 may be at least one of InAlGaN, GaN, AlGaN, GaInN, AlN, and InN that are undoped and contain nitrogen (N) or at least one of InAlGaP, GaP AlGaP, GaInP, AlP, and InP that are undoped and contain phosphorus (P). However, the embodiment is not limited thereto, and, the buffer layer 1200 may be GaInP in order to manufacture the light-emitting diode 300 of FIG. 1.

The separation layer 1300 is disposed on the buffer layer 1200. In case that a semiconductor rod (shown in FIG. 13) is separated from the lower substrate 1000 in an operation to be described later, the separation layer 1300 may be removed by a chemical method.

The separation layer 1300 may be etched and removed in an operation to be described below, thereby performing a function of separating the light-emitting diode 300 from the lower substrate 1000. The removing of the separation layer 1300 may be performed by the chemical lift off method (CLO) as described above, and accordingly, an end surface of the light-emitting diode 300 and a surface of the separation layer 1300 may have substantially the same shape. For example, the end surface of the light-emitting diode 300 may have a flat surface.

In the process of etching a semiconductor structure 3000, the separation layer 1300 may perform a function of an etching stopper between the semiconductor structure 3000 and the buffer layer 1200. For example, in case that the semiconductor structure 3000 is etched, the separation layer 1300 may be simultaneously patterned by a process or may be patterned by different processes.

The first semiconductor layer 3100 may be formed on the separation layer 1300, and the separation layer 1300 may contain a material in which a crystal of the first semiconductor layer 3100 grows smoothly. The separation layer 1300 may contain at least one of an insulating material and a conductive material. As an example, the separation layer 1300 may contain silicon oxide ($SiO_x$), silicon nitride ($SiN_x$), silicon oxynitride ($SiO_xN_y$), or the like as an insulating material and may also contain AlAs, AlGaAs, ITO, IZO, IGO, ZnO, graphene, graphene oxide, or the like as conductive materials. However, the embodiment is not limited thereto.

Figure 7:
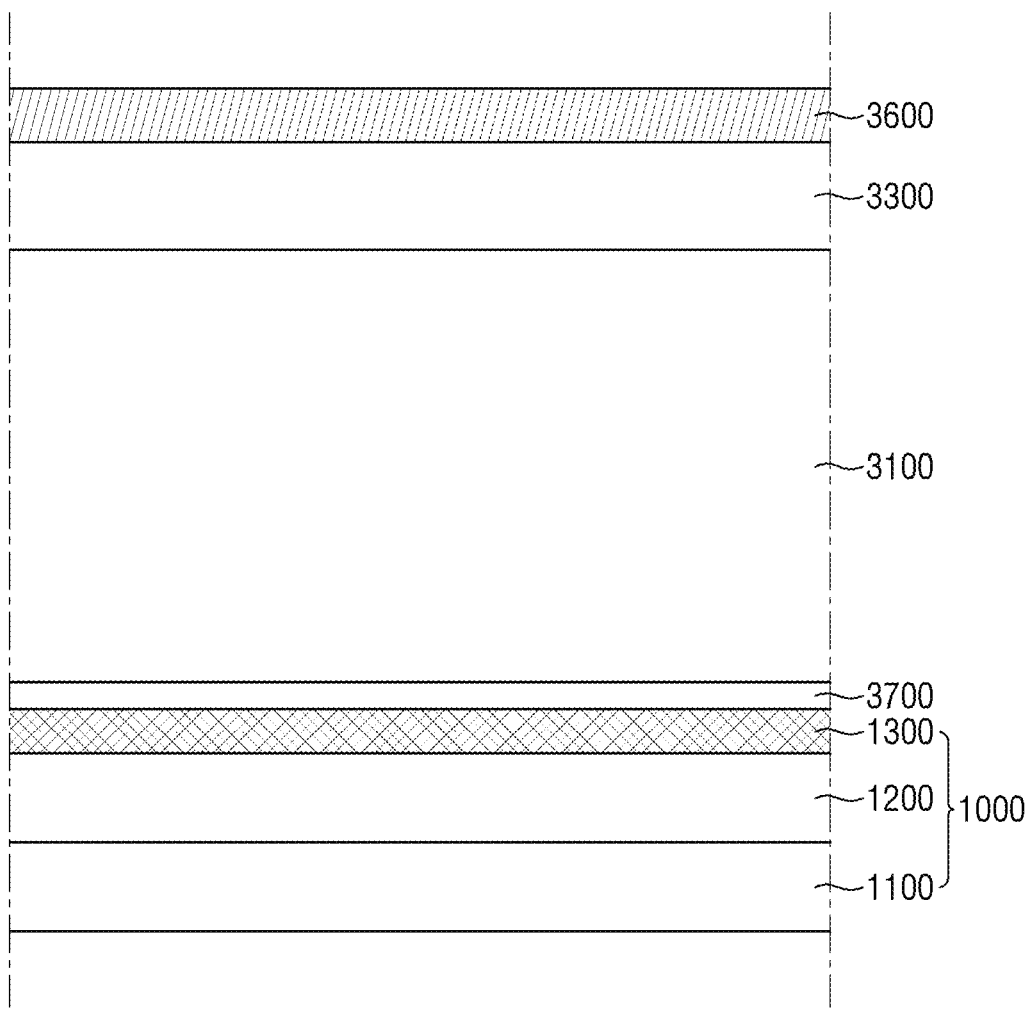
Figure 8:
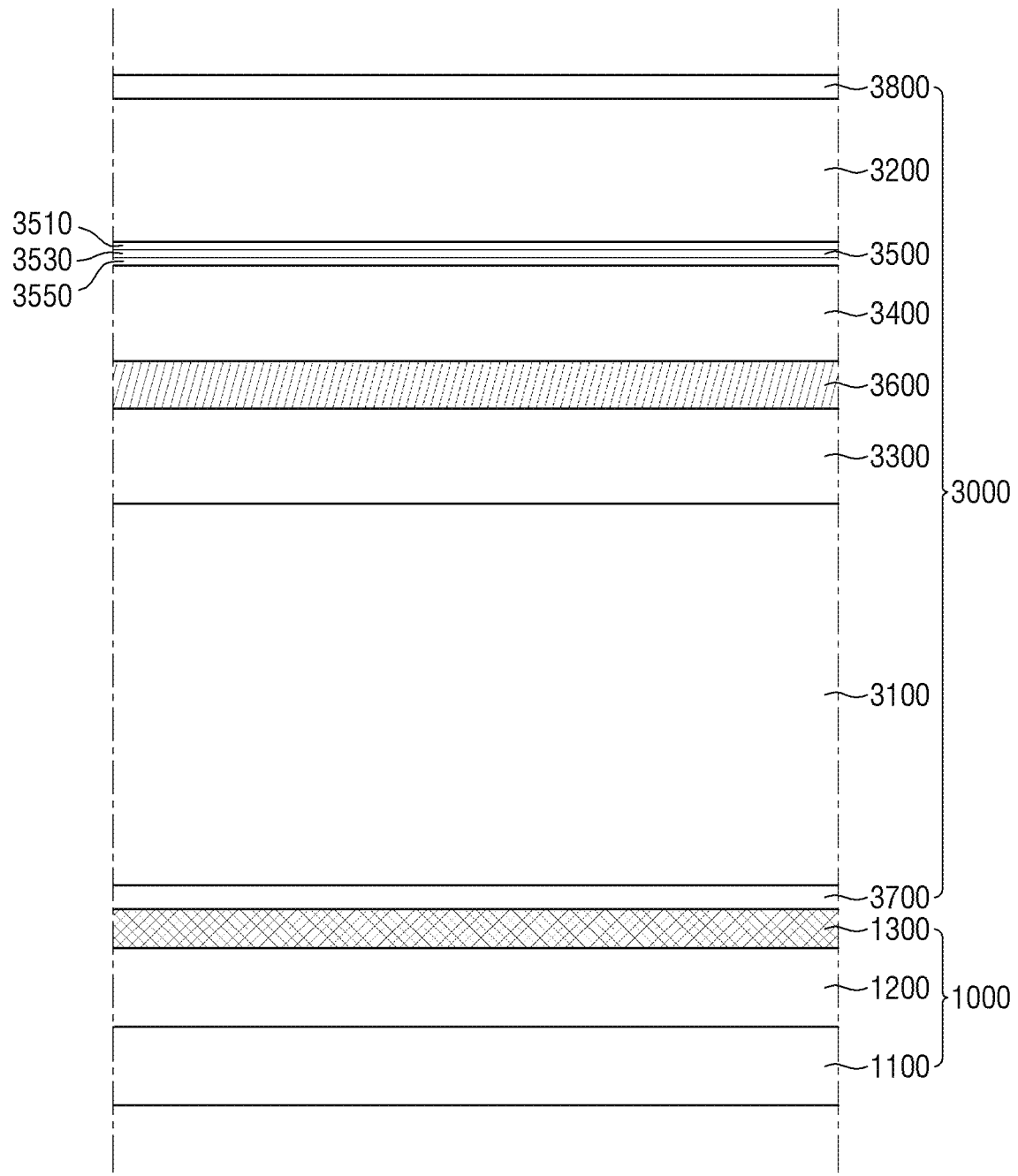

Referring to FIG. 7, a first conductive electrode material layer (or first conductive electrode layer) 3700, the first semiconductor layer 3100, a third semiconductor layer 3300, and an active material layer (or active layer) 3600 are formed on the separation layer 1300 of the lower substrate 1000. Referring to FIG. 8, a fourth semiconductor layer 3400, a fifth semiconductor layer 3500, a second semiconductor layer 3200, and a second conductive electrode material layer (or second conductive electrode layer) 3800 are formed on the active layer 3600, and thus the semiconductor structure 3000 is formed on the separation layer 1300 of the lower substrate 1000.

The semiconductor layers included in the semiconductor structure 3000 may be formed by performing a conventional process as described above. The first conductive electrode layer 3700, the first semiconductor layer 3100, the third semiconductor layer 3300, the active layer 3600, the fourth semiconductor layer 3400, the fifth semiconductor layer 3500, the second semiconductor layer 3200, and the second conductive electrode layer 3800 may be sequentially formed on the separation layer 1300, and these layers may contain the same materials as the conductive electrode layer 370, the semiconductors 310, and 330, the active layer 360, the semiconductors 340, 350, and 320, and the conductive electrode layer 380 of the light-emitting diode 300, respectively. For example, the layers stacked in the semiconductor structure 3000 may correspond to the respective materials of the light-emitting diode 300. The semiconductor structure 3000 may be partially etched in an operation to be described below to form a semiconductor rod (shown in FIG. 12).

Although not shown in the drawings, at least one of the first and second conductive electrode layers 3700 and 3800 may be omitted in the semiconductor structure 3000. As described above, in the light-emitting diode 300, the conductive electrode layers 370 and 380 may be omitted, or only one of the conductive electrode layers 370 and 380 may be included. Unlike FIG. 8, in the semiconductor structure 3000, some members may be omitted or additionally included. Hereinafter, a case in which the semiconductor structure 3000 includes the first and second conductive electrode layers 3700 and 3800 will be described as an example.

The fifth semiconductor layer 3500 and the fifth semiconductor 350 described above may contain substantially the same material. For example, the fifth semiconductor layer 3500 is represented by the following Chemical Formula 1 and may contain a compound satisfying the following Equation 1.

$$Al_xGa_{1-x}InP,$$ Chemical Formula 1

(where, x satisfies 0.1≤x≤0.9),

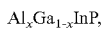
Equation 1 where M refers to a content of aluminum (Al) with respect to a content of gallium (Ga) contained in AlGaInP [the content of aluminum (Al) in AlGaInP (at. %)/the content of gallium (Ga) in AlGaInP (at. %)].

A lattice constant difference between the second semiconductor layer 3200 and the fourth semiconductor layer 3400 may be reduced by forming the fifth semiconductor layer 3500 on the fourth semiconductor layer 3400. The growth of p-GaP may not be smooth because of a lattice constant difference between a material of the fourth semiconductor layer 3400, for example, p-AlInP and p-GaP of the second semiconductor layer 3200. Since the lattice constant difference between these semiconductor materials is about 0.2 Å, the growth is not smooth because of lattice mismatch, and surface cracks may occur on the formed second semiconductor layer 3200, for example, a p-GaP layer.

On the other hand, according to an embodiment, the fifth semiconductor layer 3500 is formed between the fourth semiconductor layer 3400 and the second semiconductor layer 3200, and thus the lattice constant difference therebetween may be decreased. The lattice constant of the fifth semiconductor layer 3500 may have a value between lattice constants of p-AlInP of the fourth semiconductor layer 3400 and p-GaP of the second semiconductor layer 3200. Accordingly, in the second semiconductor layer 3200 formed on the fifth semiconductor layer 3500, the lattice mismatch may be decreased and the crystals may be grown smoothly.

As shown in FIG. 8, the fifth semiconductor layer 3500 of the semiconductor structure 3000 may include first to third sub-semiconductor layers 3510, 3530, and 3550, but the embodiment is not limited thereto. As described above, the fifth semiconductor 350 of the light-emitting diode 300 may include a greater number of sub-semiconductor layers, or in some cases, the content of semiconductor crystals may be linearly changed in a certain region. For example, although not shown in the drawing, the fifth semiconductor layer 3500 may be formed to have a structure different from that of FIG. 8.

At least a part of the semiconductor structure 3000 is etched in a direction perpendicular to the lower substrate 1000 to form a semiconductor crystal 3000'.

The operation of forming the semiconductor crystal 3000' by vertically etching the semiconductor structure 3000 may include a patterning process that may be generally performed. For example, the operation of forming the semiconductor crystal 3000' by etching the semiconductor structure 3000 may include forming an etching mask layer 1600 and an etching pattern layer 1700 on the semiconductor structure 3000, etching the semiconductor structure 3000 according to a pattern of the etching pattern layer 1700, and removing the etching mask layer 1600 and the etching pattern layer 1700.

Figure 9:
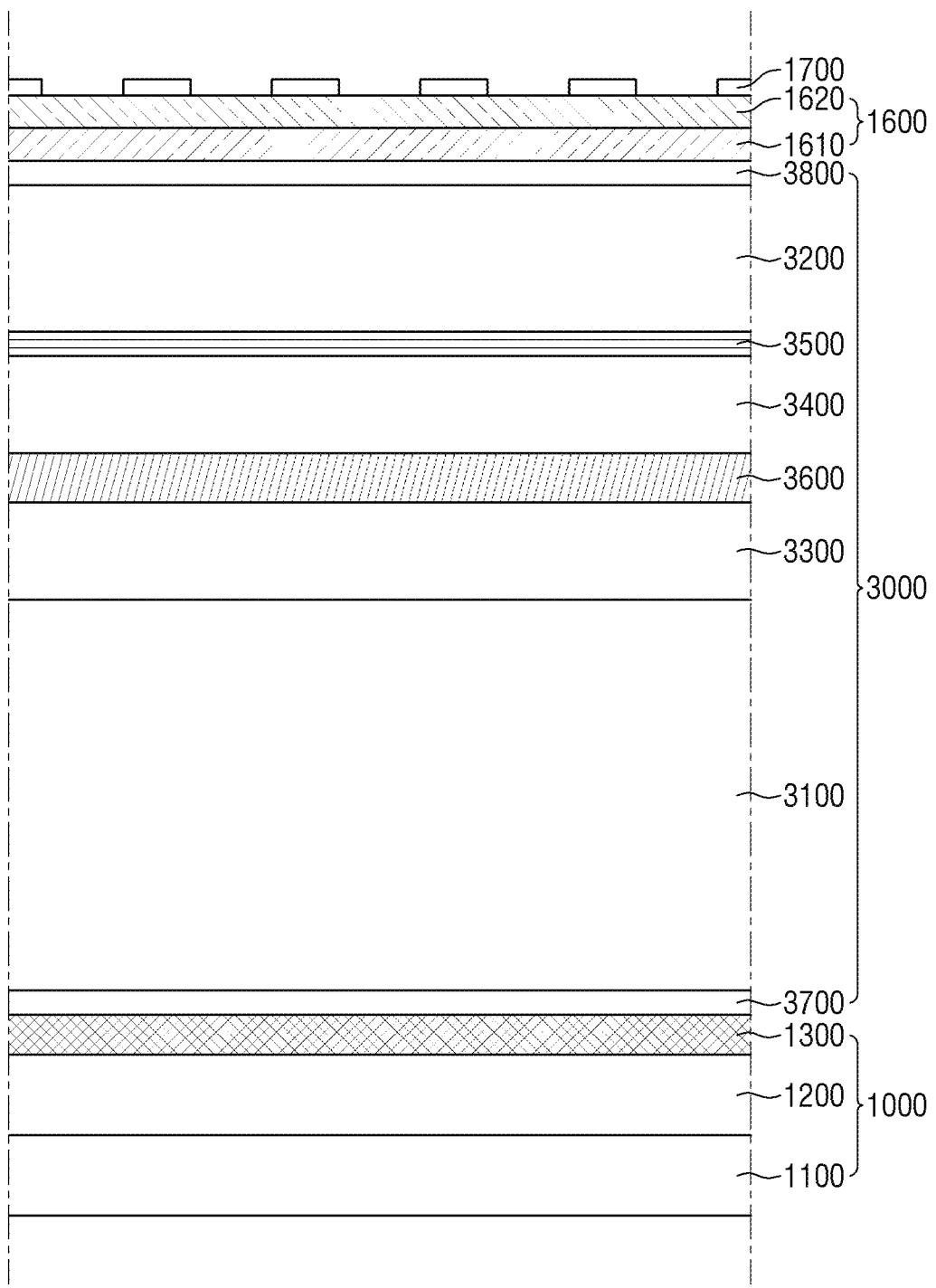

First, referring to FIG. 9, the etching mask layer 1600 may function as a mask for continuous etching of the semiconductor structure 3000. The etching mask layer 1600 may include a first etching mask layer 1610 containing an insulating material and a second etching mask layer 1620 containing a metal.

As the insulating material contained in the first etching mask layer 1610 of the etching mask layer 1600, an oxide or nitride may be used. For example, it may be formed of (or include) silicon oxide (SiO$_x$), silicon nitride (SiN$_x$), silicon oxynitride (SiO$_x$N$_y$), or the like. A thickness of the first etching mask layer 1610 may range from about 0.5 μm to about 1.5 μm, but the embodiment is not limited thereto.

In the case of the second etching mask layer 1620, it is not particularly limited as long as it is a conventional material that may function as a mask for continuous etching of the semiconductor structure 3000. For example, the second etching mask layer 1620 may contain chromium (Cr) or the like. A thickness of the second etching mask layer 1620 may range from about 30 nm to about 150 nm, but the embodiment is not limited thereto.

The etching pattern layer 1700 formed on the etching mask layer 1600 may have one or more nanopatterns spaced apart from each other. The etching pattern layer 1700 may function as a mask for continuous etching of the semiconductor structure 3000. A method for forming the etching pattern layer 1700 is not particularly limited as long as it is formed by a method capable of forming a pattern including a polymer, a polystyrene sphere, a silica sphere, or the like.

As an example, in case that the etching pattern layer 1700 contains a polymer, a conventional method that may form a pattern using a polymer may be applied. For example, the etching pattern layer 1700 containing a polymer may be formed by a method such as photolithography, e-beam lithography, nanoimprint lithography, or the like.

In particular, a structure, a shape, and a separated distance of the etching pattern layer 1700 may be associated with a shape of the light-emitting diode 300 that is finally manufactured. For example, in case that the etching pattern layer 1700 has circular patterns spaced apart from each other, the light-emitting diode 300 manufactured by vertically etching the semiconductor structure 3000 may have a cylindrical shape.

In the etching pattern layer 1700, other nanopatterns may be disposed so as to surround a nanopattern as a center. Here, six different nanopatterns may be disposed so as to surround an outer surface of a nanopattern as a center, and the six nanopatterns may be divided and disposed at equal intervals. However, the embodiment is not limited thereto.

The separated distance between nanopatterns may be greater than a diameter of each nanopattern. For example, the separated distance between the nanopatterns may be in a range of about 2 times to about 4 times, or about 3 times the diameter of each nano-pattern. Further, the nanopatterns may have diameters of different sizes from each other.

Figure 10:
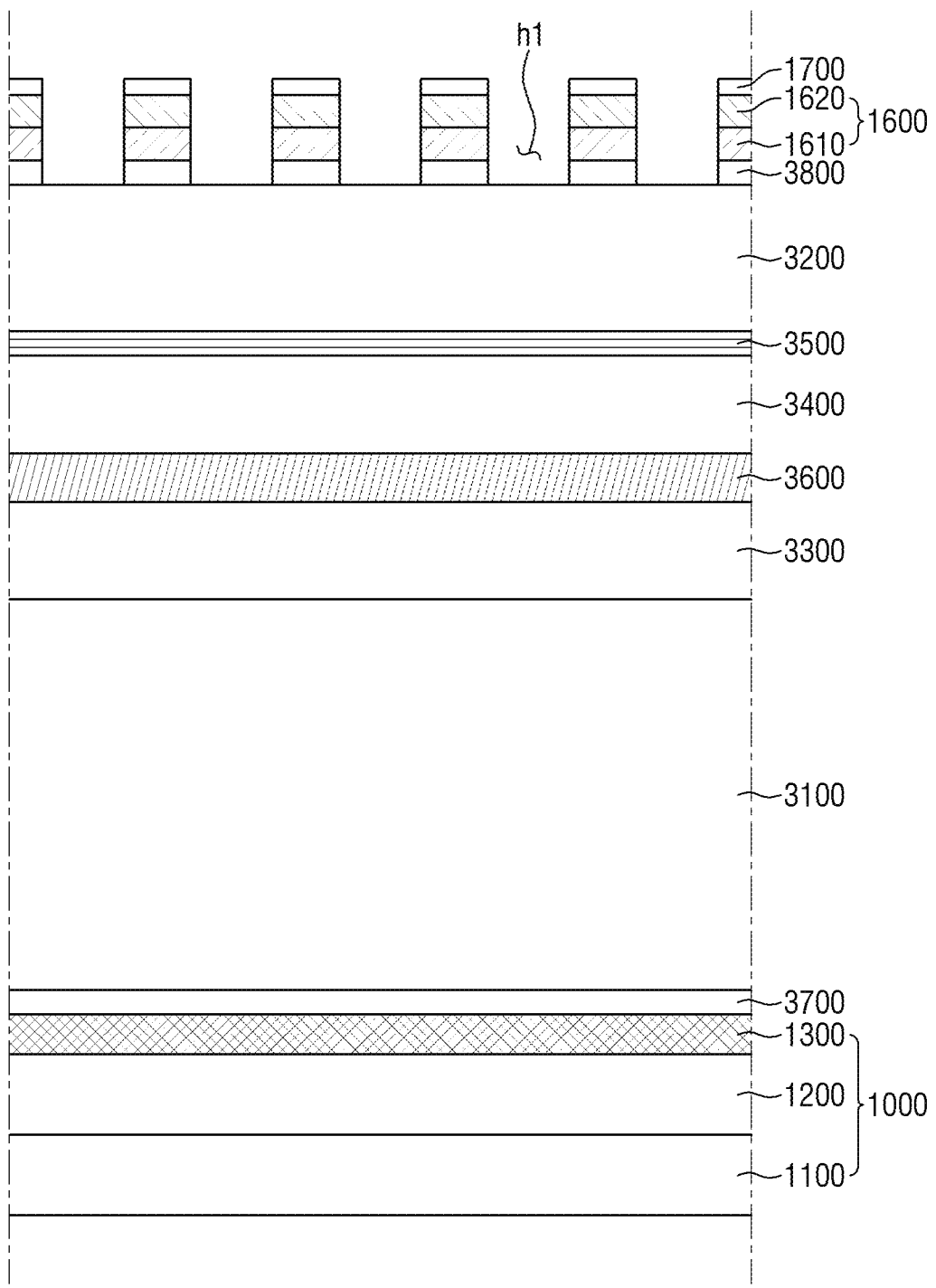
Figure 11:
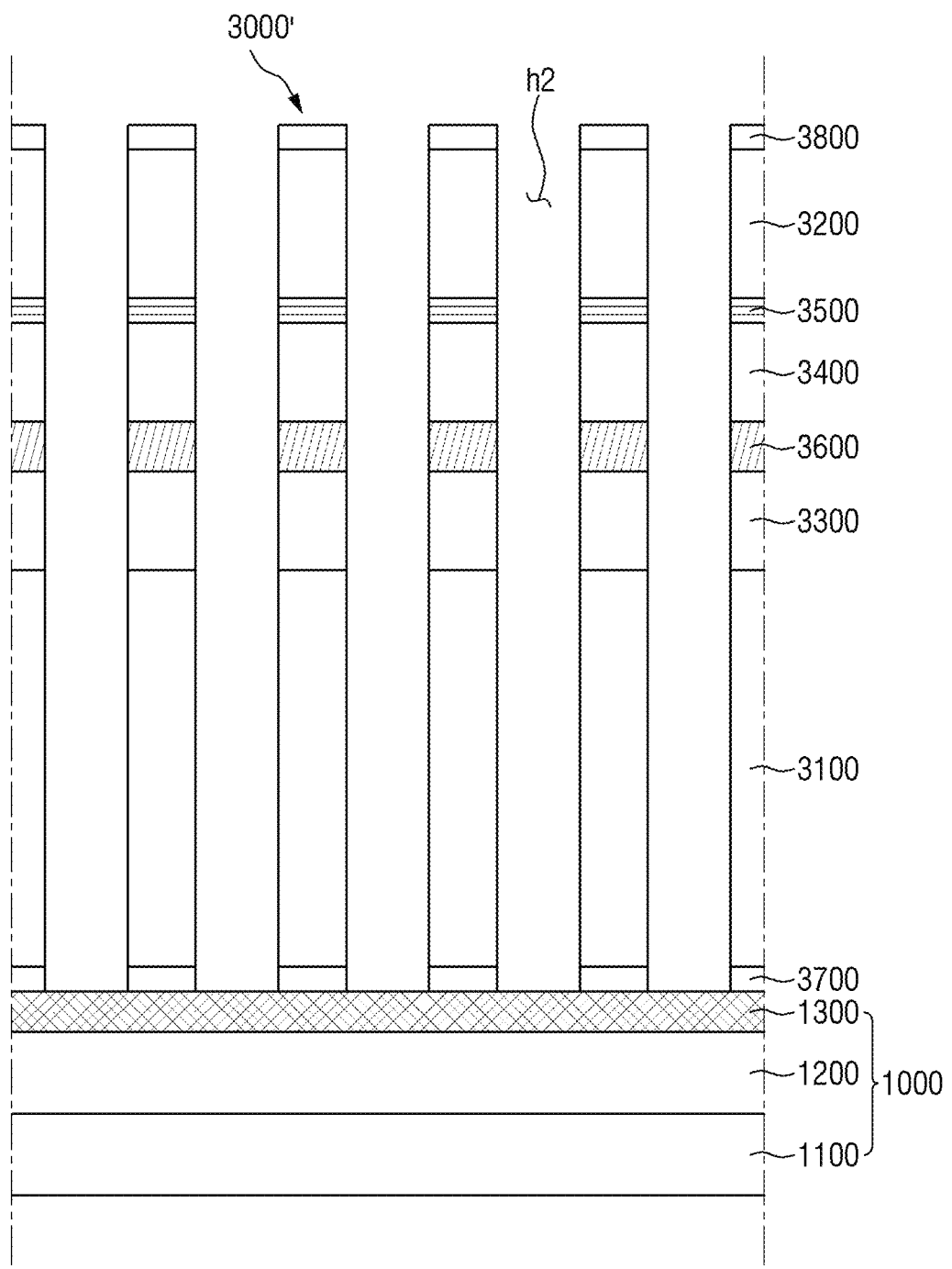

Referring to FIGS. 10 and 11, the semiconductor structure 3000 is etched along the nanopatterns of the etching pattern layer 1700 to form the semiconductor crystal 3000'. The forming of the semiconductor crystal 3000' may include a first etching operation of forming a first hole h1 by patterning the etching mask layer 1600 and the second conductive electrode layer 3800 by vertically etching regions in which the nanopatterns of the etching pattern layer 1700 are spaced apart, an operation of removing the etching pattern layer 1700, a second etching operation of forming a second hole h2 by etching in a direction perpendicular to the lower substrate 1000 from the second semiconductor layer 3200 to the first conductive electrode material layer 3700 along the first hole h1, and an operation of removing the etching mask layer 1600.

A method of forming the first hole h1 and the second hole h2 may be performed by a conventional method. For example, the etching process may include dry etching, wet etching, reactive ion etching (ME), inductively coupled plasma reactive ion etching (ICP-RIE), or the like. In the dry etching, anisotropic etching is possible, and thus it may be suitable for forming the holes h1 and h2 by vertical etching. When using the etching method of the above-described method, an etchant may include $Cl_2$, $O_2$, or the like. However, the embodiment is not limited thereto.

In some embodiments, the etching of the semiconductor structure 3000 may be performed by mixing dry etching and wet etching. For example, after etching in a depth direction by the dry etching, etched sidewalls may be placed on a plane perpendicular to the surface through a wet etching method, which may be isotropic etching.

As shown in FIG. 10, the first hole h1 is formed by etching the etching mask layer 1600 and the second conductive electrode layer 3800 by performing the first etching operation. The second etching operation of forming the second hole h2 is performed by etching from the second semiconductor layer 3200 to the first conductive electrode layer 3700 along the first hole h1. Finally, as shown in FIG. 11, the etching mask layer 1600 or the etching pattern layer 1700 remaining on the etched semiconductor structure 3000 may be removed to form the semiconductor crystal 3000'.

The etching of the semiconductor structure 3000 to form the semiconductor crystal 3000' may include the first etching operation and the second etching operation to perform different patterning processes, and a patterning process may be performed to pattern the first conductive electrode layer 3700 along the etching pattern layer 1700.

An insulating film 3900 partially surrounding an outer surface of the semiconductor crystal 3000' is formed to form the semiconductor rod.

The insulating film 3900 is an insulating material formed on an outer surface of the semiconductor rod and may be formed using a method of coating or immersing an insulating material on the outer surface of the vertically etched semiconductor crystal 3000'. However, the embodiment is not limited thereto. As an example, the insulating film 3900 may be formed by atomic layer deposition (ALD). The insulating film 3900 may form the insulating film 390 of the light-emitting diode 300.

Figure 12:
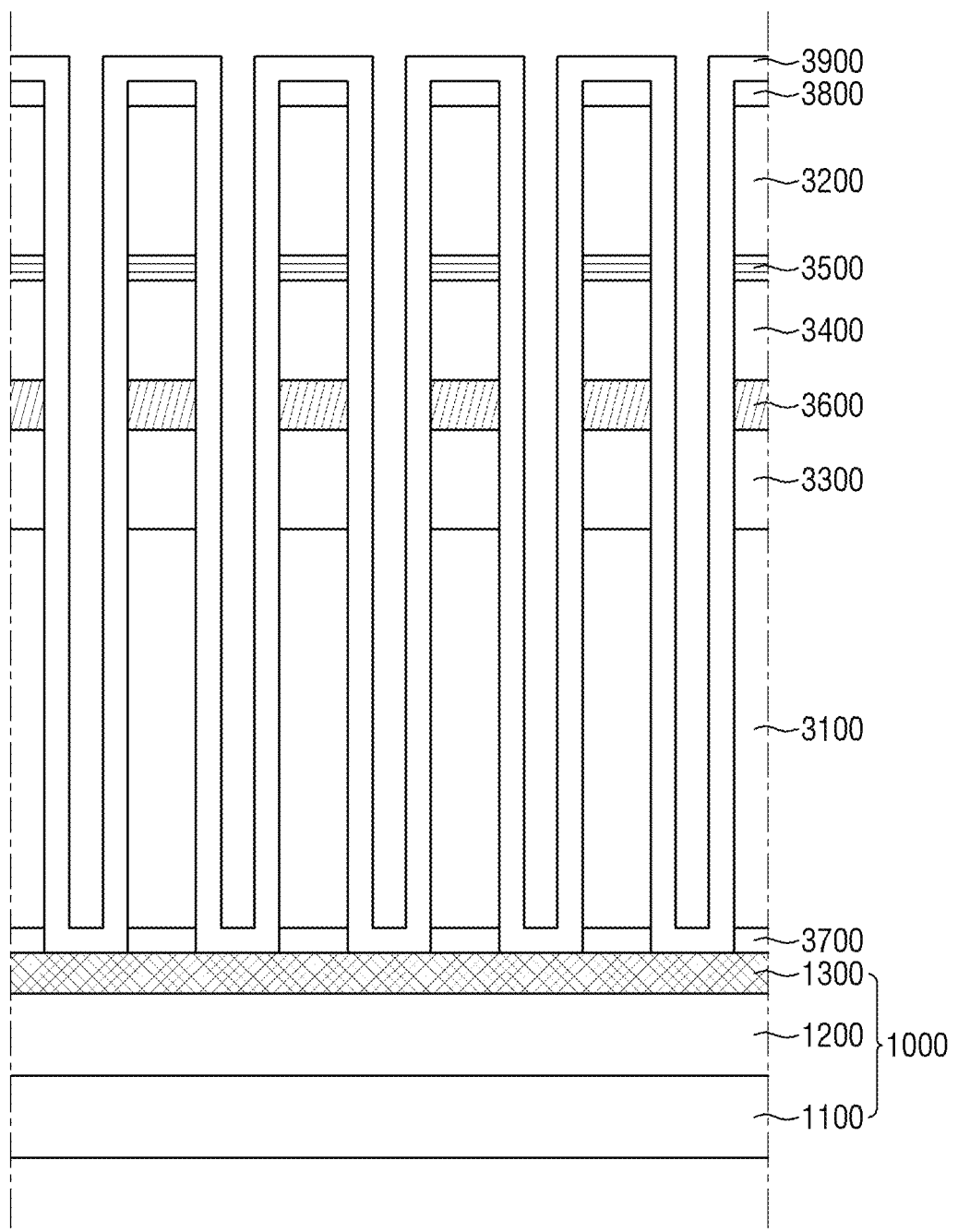
Figure 13:
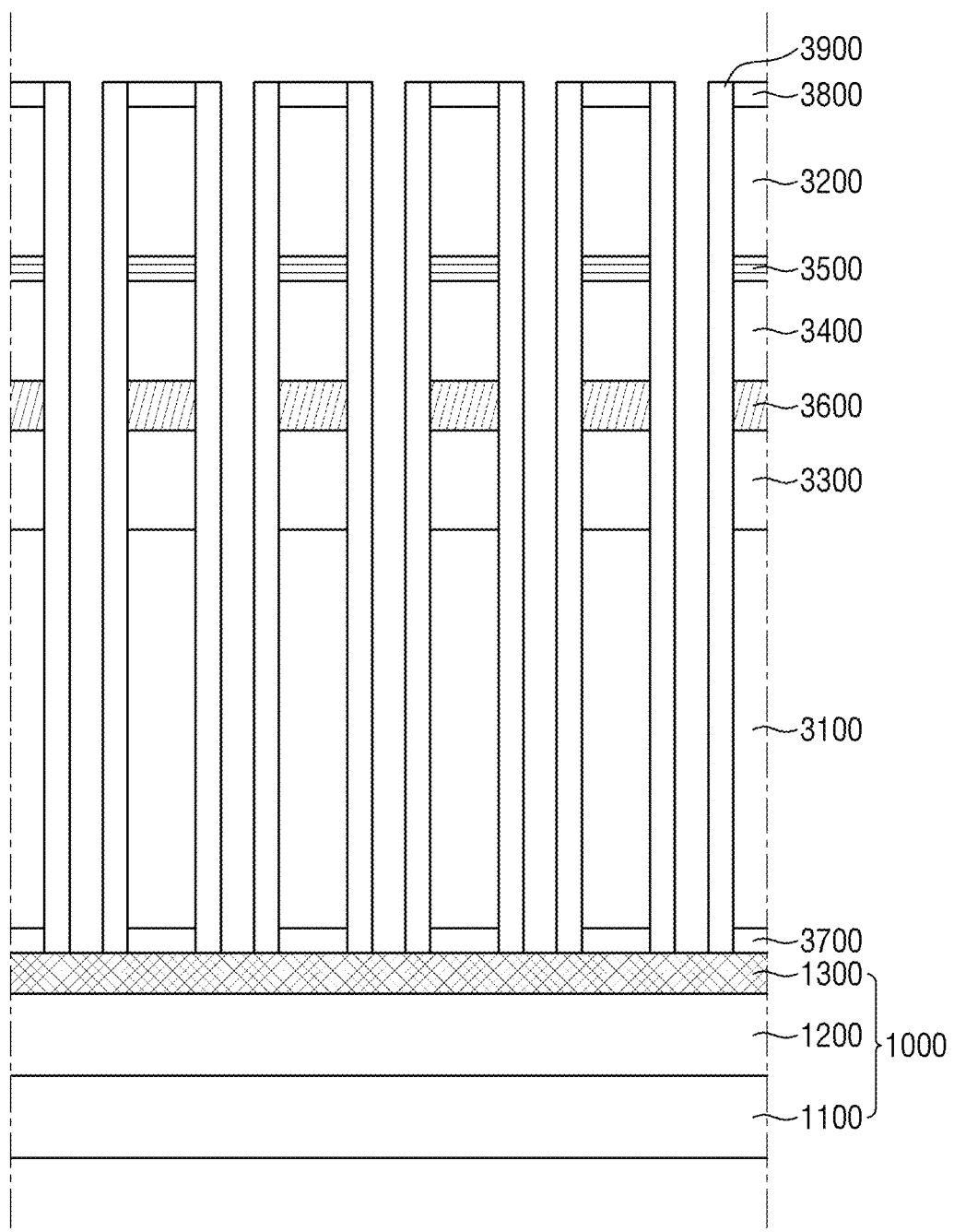

Referring to FIG. 12, the insulating film 3900 may be formed on side and upper surfaces of the semiconductor crystal 3000' and on the separation layer 1300 exposed to the outside as the semiconductor crystals 3000' are spaced from each other and etched. In case that the insulating film 3900 is formed, the insulating film 3900 formed on the upper surface of the semiconductor crystal 3000' is removed to expose side surfaces of both end portions of the semiconductor crystal 3000'. As shown in FIG. 13, the insulating film 3900 disposed on at least the upper surface of the semiconductor crystal 3000' and on the separation layer 1300 may be removed to expose the upper surface of the semiconductor crystal 3000'. To this end, processes such as dry etching or etch-back, which is anisotropic etching, may be performed. Accordingly, the insulating film 3900 surrounding an outer circumferential surface of the semiconductor crystal 3000' may be partially removed, and the semiconductor rod including the semiconductor crystal 3000' and the insulating film 3900 may be formed. The semiconductor rod may be separated from the lower substrate 1000 in an operation to be described below to form the light-emitting diode 300.

Figure 14:
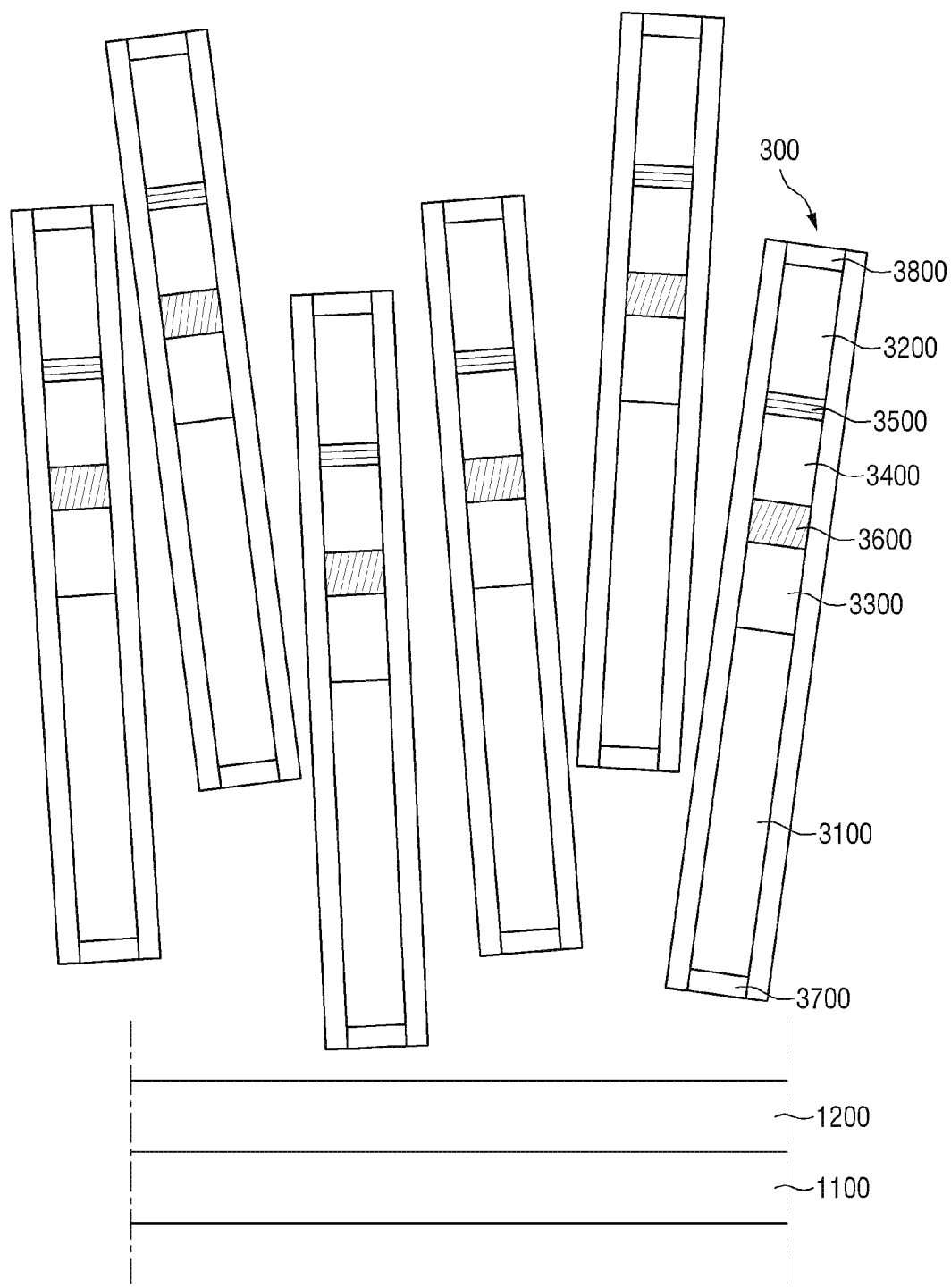

As shown in FIG. 14, the semiconductor rod is separated from the lower substrate 1000 to form the light-emitting diode 300. The operation of separating the semiconductor rod may include removing of the separation layer 1300 by a chemical lift off method (CLO) method. In order to remove the separation layer 1300, a wet etching process may be performed using an etchant for separation such as hydrofluoric acid (HF) or a buffered oxide etchant (BOE), but the embodiment is not limited thereto.

The light-emitting diode 300 of FIG. 1 may be manufactured by the method described above. In the forming of the semiconductor structure 3000, a shape of the fifth semiconductor 350 of the light-emitting diode 300 may change according to the number of sub-semiconductor layers included in the fifth semiconductor layer 3500, which is represented by Chemical Formula 1 and satisfying Equation 1.

The light-emitting diode 300 of FIG. 1 may emit light of a specific wavelength band, for example, red light, and the display device 1 according to an embodiment may include at least one light-emitting diode 300 to display light of a specific color.

Figure 15:
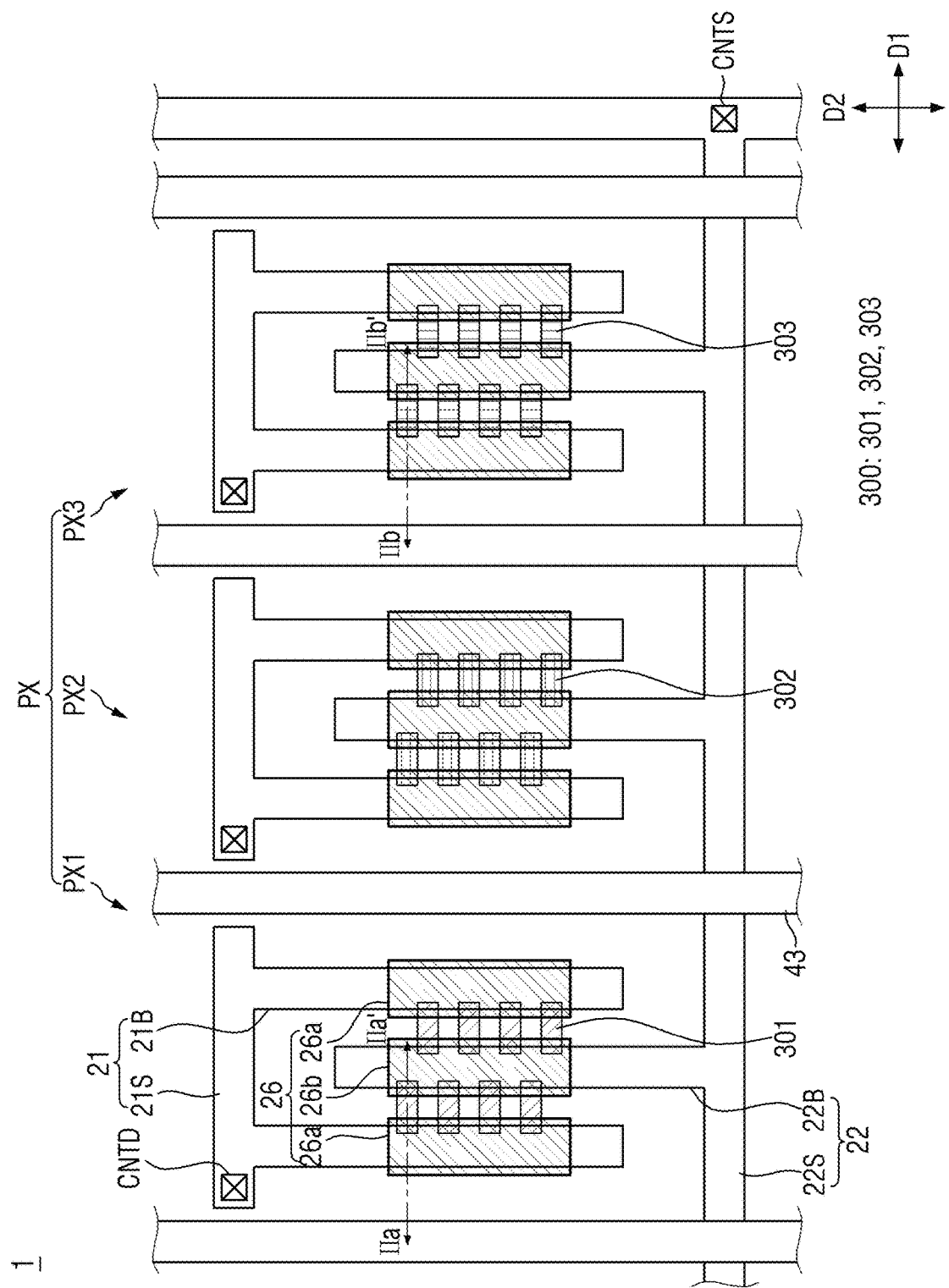
FIG. 15 is a schematic plan view of a display device manufactured by the method according to an embodiment.

FIG. 15 is a schematic plan view of a display device manufactured by a method according to an embodiment.

Referring to FIG. 15, the display device 1 may include pixels PX. Each of the pixels PX may include one or more light-emitting diodes 300 that emit light in a specific wavelength band to display a specific color.

Each of the pixels PX may include a first sub-pixel PX1, a second sub-pixel PX2, and a third sub-pixel PX3. The first sub-pixel PX1 may emit light of a first color, the second sub-pixel PX2 may emit light of a second color, and the third sub-pixel PX3 may emit light of a third color. The first color may be red, the second color may be green, and the third color may be blue, but the embodiment is not limited thereto, and each sub-pixel PXn may also emit light of a same color (where n is a natural number). Although FIG. 15 illustrates that each of the pixels PX includes three sub-pixels, the embodiment is not limited thereto, and each of the pixels PX may include a greater number of sub-pixels.

Each sub-pixel PXn of the display device 1 may include regions defined as a light-emitting region and a non-light-emitting region. The light-emitting region is defined as a region in which the light-emitting diode 300 included in the display device 1 is disposed to emit light in a specific wavelength band. The non-light-emitting region is a region other than the light-emitting region and may be defined as a region in which the light-emitting diode 300 is not disposed and no light is emitted.

The sub-pixel PXn of the display device 1 may include banks 40 (see FIG. 18), electrodes 21 and 22, and the light-emitting diode 300.

The electrodes 21 and 22 may be electrically connected to the light-emitting diodes 300 and may receive a predetermined voltage so that the light-emitting diodes 300 emit light. At least a part of each of the electrodes 21 and 22 may be used to form an electric field in the sub-pixel PXn in order to align the light-emitting diodes 300. However, the embodiment is not limited thereto, and in some cases, the electric field may also be formed by a separate alignment signal application device.

Referring to FIG. 15, the electrodes 21 and 22 may include a first electrode 21 and a second electrode 22. In an embodiment, the first electrode 21 may be a pixel electrode separated for each sub-pixel PXn, and the second electrode 22 may be a common electrode commonly electrically connected along each sub-pixel PXn. One of the first electrode 21 and the second electrode 22 may be an anode of the light-emitting diode 300, and the other may be a cathode of the light-emitting diode 300. However, the embodiment is not limited thereto, and the arrangement may be vice versa.

Each of the first electrode 21 and the second electrode 22 may include electrode stem portions 21S and 22S disposed to extend in a first direction D1 and one or more electrode branch portions 21B and 22B branched to extend from the electrode stem portions 21S and 22S in a second direction D2, which is a direction intersecting the first direction D1.

Specifically, the first electrode 21 may include a first electrode stem portion 21S disposed to extend in the first direction D1 and at least one first electrode branch portion 21B branched from the first electrode stem portion 21S and extending in the second direction D2.

Both ends of the first electrode stem portion 21S of an arbitrary pixel PX are spaced apart from each other and terminate between each sub-pixel PXn and may be placed to be substantially colinear to the first electrode stem portion 21S of a neighboring sub-pixel PX belonging to a same row (for example, adjacent in the first direction D1). Accordingly, the first electrode stem portion 21S disposed in each sub-pixel PXn may apply different electrical signals to each of the first electrode branch portions 21B, and each of the first electrode branch portions 21B may be driven separately.

The first electrode branch portion 21B is branched from at least a portion of the first electrode stem portion 21S, extends in the second direction D2, and may terminate while being spaced apart from a second electrode stem portion 22S disposed to face the first electrode stem portion 21S.

The second electrode 22 may include the second electrode stem portion 22S that extends in the first direction D1 and is spaced apart from the first electrode stem portion 21S to face the first electrode stem portion 21S, and a second electrode branch portion 22B that is branched from the second electrode stem portion 22S and extends in the second direction D2. However, the second electrode stem portion 22S may have another end portion extending to the sub-pixels PXn adjacent in the first direction D1. Accordingly, both ends of the second electrode stem portion 22S of an arbitrary pixel PX may be electrically connected to the second electrode stem portions 22S of the neighboring pixels between the pixels PX.

The second electrode branch portion 22B may be spaced apart from and face the first electrode branch portion 21B and may terminate while being spaced apart from the first electrode stem portion 21S. For example, an end portion of the second electrode branch portion 22B may be electrically connected to the second electrode stem portion 22S, and another end portion thereof may be disposed in the sub-pixel PXn while being spaced apart from the first electrode stem portion 21S.

The drawing illustrates that two first electrode branch portions 21B are disposed, and the second electrode branch portion 22B is disposed therebetween, but the embodiment is not limited thereto.

The banks 40 may include a third bank 43 disposed at a boundary between each sub-pixel PXn, and a first bank 41 and a second bank 42 disposed under each of the electrodes 21 and 22. Although the first bank 41 and the second bank 42 are not shown in the drawing, the first bank 41 and the second bank 42 may be disposed under the first electrode branch portion 21B and the second electrode branch portion 22B, respectively.

The third bank 43 may be disposed at the boundary between each sub-pixel PXn. Each end portion of the first electrode stem portions 21S may terminate to be spaced apart from each other and from the third bank 43. The third bank 43 may extend in the second direction D2 to be disposed at the boundary of the sub-pixels PXn arranged in the first direction D1. However, the embodiment is not limited thereto, and the third bank 43 may extend in the first direction D1 to be disposed at the boundary of the sub-pixels PXn arranged in the second direction D2. The sub-pixels PXn may be divided based on the third bank 43. The third bank 43, the first bank 41, and the second bank 42 may contain the same material, and may be formed by substantially a same process.

Although not shown in the drawing, a first insulating layer entirely covering (or overlapping) the sub-pixel PXn including the first electrode branch portion 21B and the second electrode branch portion 22B may be disposed on each sub-pixel PXn. The first insulating layer may protect each of the electrodes 21 and 22 and may insulate the electrodes 21 and 22 from each other so as not to directly contact each other.

The light-emitting diodes 300 may be arranged between the first electrode branch portion 21B and the second electrode branch portion 22B. At least a part of the light-emitting diodes 300 may have an end portion electrically connected to the first electrode branch portion 21B, and another end portion electrically connected to the second electrode branch portion 22B.

The light-emitting diodes 300 may be spaced apart in the second direction D2 and be arranged substantially parallel to each other. The spacing between the light-emitting diodes 300 is not particularly limited. In some embodiments, the light-emitting diodes 300 are disposed to be adjacent to each other to form a group, and other light-emitting diodes 300 may form a group while being spaced apart from each other at certain intervals and may also be oriented and aligned in a direction with a non-uniform density.

Contact electrodes 26 may be disposed on the first electrode branch portion 21B and the second electrode branch portions 22B. However, the contact electrodes 26 may be substantially disposed on the first insulating layer, and at least some of the contact electrodes 26 may contact or be electrically connected to the first electrode branch portion 21B and the second electrode branch portion 22B.

The contact electrodes 26 may be disposed to extend in the second direction D2 and may be spaced apart from each other in the first direction D1. Each of the contact electrodes 26 may contact at least one end portion of the light-emitting diode 300 and may contact the first electrode 21 or the second electrode 22 to receive an electrical signal. Accordingly, the contact electrodes 26 may transmit the electrical signal transmitted from each of the electrodes 21 and 22, to the light-emitting diode 300.

The contact electrodes 26 may include a first contact electrode 26a and a second contact electrode 26b. The first contact electrode 26a may be disposed on the first electrode branch portion 21B and may contact an end portion of the light-emitting diode 300, and the second contact electrode 26b may be disposed on the second electrode branch portion 22B and may contact another end portion of the light-emitting diode 300.

Each of the first electrode stem portion 21S and the second electrode stem portion 22S may be electrically connected to a circuit element layer of the display device 1 through contact holes, for example, a first electrode contact hole CNTD and a second electrode contact hole CNTS. The drawing illustrates that a single second electrode contact hole CNTS is formed in the second electrode stem portion 22S of the sub-pixels PXn. However, the embodiment is not limited thereto, and in some embodiments, the second electrode contact hole CNTS may be formed for each sub-pixel PXn.

Although not shown in the drawing, the display device 1 may include a second insulating layer 52 (shown in FIG. 18) and a passivation layer 55 (shown in FIG. 18) disposed so as to cover (or overlap) at least a part of each of the electrodes 21 and 22 and the light-emitting diode 300. The arrangement and structure thereof will be described below with reference to FIG. 18.

As shown in the drawing, different light-emitting diodes 301, 302, and 303 may be disposed for each sub-pixel of the display device 1, for example, the first sub-pixel PX1, the second sub-pixel PX2, and the third sub-pixel PX3. The light-emitting diode 300 disposed in the display device 1 may include a first light-emitting diode 301 disposed in the first sub-pixel PX1, a second light-emitting diode 302 disposed in the second sub-pixel PX2, and a third light-emitting diode 303 disposed in the third sub pixel PX3. The first light-emitting diode 301 may include a semiconductor layer containing phosphorus (P), as described above with reference to FIGS. 1 and 2. For example, the first sub-pixel PX1 may include the light-emitting diode 300 of FIGS. 1 and 2 to display a red color.

On the other hand, the second sub-pixel PX2 and the third sub-pixel PX3 may include the second light-emitting diode 302 and the third light-emitting diode 303, respectively, and the second and third light-emitting diodes 302 and 303 may have a different structure from the light-emitting diode 300 of FIGS. 1 and 2. The second and third light-emitting diodes 302 and 303 may emit light having a color other than red, and each of the first to third sub-pixels PX1, PX2, and PX3 may display different colors.

In an embodiment, the second light-emitting diode 302 may emit green light having a center wavelength band of about 495 nm to about 570 nm, and the third light-emitting diode 303 may emit blue light having a center wavelength band of about 450 nm to about 495 nm. However, the embodiment is not limited thereto. Each of the second light-emitting diode 302 and the third light-emitting diode 303 may include the light-emitting diode 300 having a structure different from that of FIGS. 1 and 2 to emit green and blue light.

Figure 16:
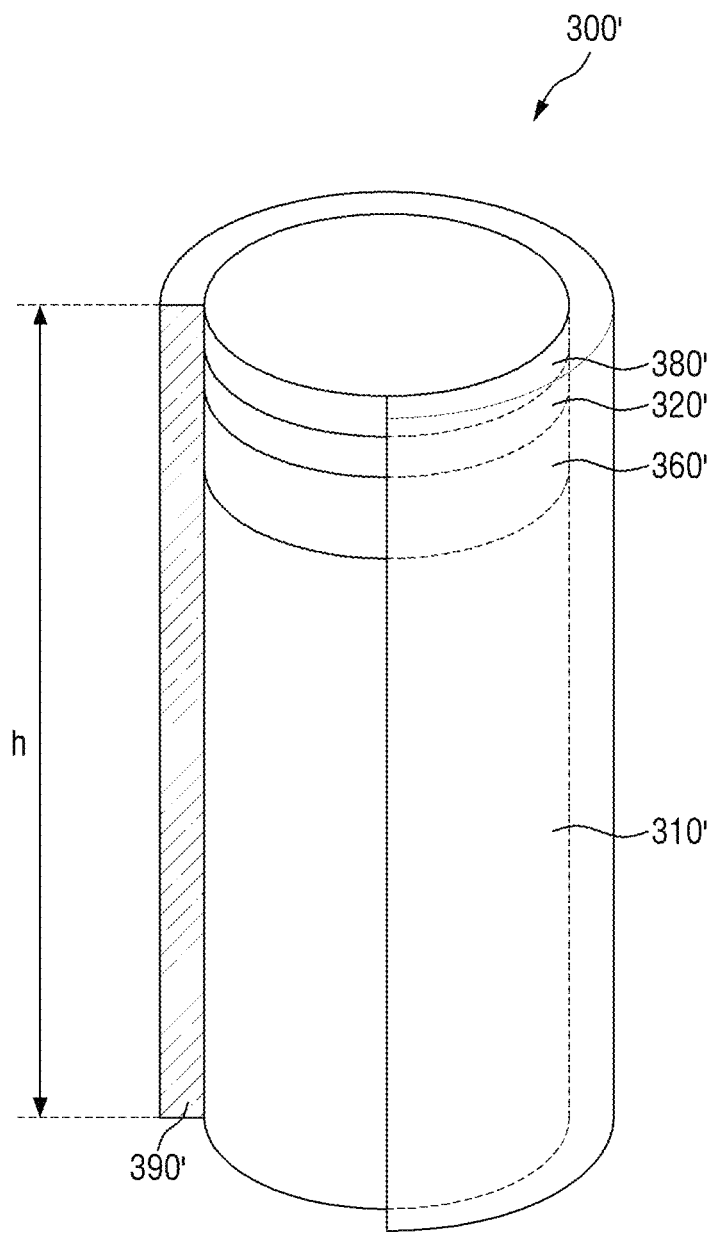
FIG. 16 is a schematic perspective view of a light-emitting diode according to another embodiment.

FIG. 16 is a schematic perspective view of a light-emitting diode according to an embodiment.

According to the embodiment, unlike in FIG. 1, some semiconductor layers may be omitted from a light-emitting diode 300', and an active layer 360' may include at least one semiconductor layer containing nitrogen (N) to emit light having a color excluding red.

Referring to FIG. 16, the third to fifth semiconductors 330, 340, and 350 and the first conductive electrode layer 370 may be omitted from the light-emitting diode 300' according to the embodiment in comparison with the light-emitting diode 300 of FIGS. 1 and 2. For example, the light-emitting diode 300' of FIG. 16 may include a first semiconductor 310', an active layer 360', a second semiconductor 320', a second conductive electrode layer 380', and an insulating film 390'. Hereinafter, repetitive descriptions will be omitted, and differences will be mainly described.

The light-emitting diode 300' of FIG. 16 may include the first semiconductor 310', the active layer 360', the second semiconductor 320', the second conductive electrode layer 380', and the insulating film 390' surrounding at least an outer surface of the active layer 360'. The first semiconductor 310', the active layer 360', the second semiconductor 320', and the second conductive electrode layer 380' are disposed in a direction in which the light-emitting diode 300' extends. The drawing illustrates that only the second conductive electrode layer 380' is disposed as a conductive electrode layer, and the insulating film 390' is disposed so as to surround all of the first semiconductor 310', the active layer 360', the second semiconductor 320', and the second conductive electrode layer 380', but the embodiment is not limited thereto.

As described above, the light-emitting diode 300' of FIG. 16 may include a semiconductor layer in which the active layer 360' contains nitrogen (N) to emit light of a color other than red, for example, blue or green. For example, the light-emitting diode 300' according to the embodiment may be a light-emitting diode emitting blue or green light, and each of the active layer 360' and other semiconductors included in the light-emitting diode 300' may contain a semiconductor material containing at least nitrogen (N).

Specifically, the first semiconductor 310' may be an n-type semiconductor. As an example, in case that the light-emitting diode 300' emits light in a blue or green wavelength band, the first semiconductor 310' may include a semiconductor material having a chemical formula of $In_xAl_yGa_{1-x-y}N$ ($0 \leq x \leq 1$, $0 \leq y \leq 1$, and $0 \leq x+y \leq 1$). For example, the semiconductor material may include one or more of InAlGaN, GaN, AlGaN, InGaN, AlN, and InN doped with an n-type dopant. The first semiconductor 310' may be doped with a first conductive type dopant, and as an example, the first conductive type dopant may include Si, Ge, Sn, or the like.

The active layer 360' is disposed on the first semiconductor 310'. Similar to the active layer 360 of FIG. 1, the active layer 360' of FIG. 16 may also include a material having a single or multiple quantum well structure to emit light in a specific wavelength band. As an example, in case that the active layer 360' emits light in a blue or green wavelength band, the active layer 360' may include a material such as AlGaN or AlInGaN. In particular, in case that the active layer 360' has a multiple quantum well structure in which quantum layers and well layers are alternately stacked, the quantum layer may include a material such as AlGaN or AlInGaN, and the well layer may include a material such as GaN or AlInN.

The second semiconductor 320' is disposed on the active layer 360'. The second semiconductor 320 may be a p-type semiconductor, and as an example, in case that the light-emitting diode 300' emits light in a blue or green wavelength band, the second semiconductor 320' may include a semiconductor material having a chemical formula of $In_xAl_yGa_{1-x-y}N$ ($0 \leq x \leq 1$, $0 \leq y \leq 1$, and $0 \leq x+y \leq 1$). For example, the semiconductor material may include one or more of InAlGaN, GaN, AlGaN, InGaN, AlN, and InN doped with a p-type dopant. The second semiconductor 320' may be doped with a second conductive type dopant, and as an example, the second conductive type dopant may include Mg, Zn, Ca, Se, Ba, or the like.

In an embodiment, the light-emitting diode 300' may include a semiconductor layer containing nitrogen (N) to emit blue or green light. In case that the active layer 360' of the light-emitting diode 300' includes the semiconductor layer containing nitrogen (N), it may emit light in a short wavelength band with a larger band gap energy than the semiconductor layer containing phosphorus (P). A central wavelength band of light emitted from the light-emitting diode 300' may be adjusted by adjusting the type or content of nitrogen (N) of the semiconductor layer included in the active layer 360'.

Unlike the light-emitting diode 300 of FIGS. 1 and 2, in the active layer 360' of FIG. 16, a lattice constant difference between the first semiconductor 310' and the second semiconductor 320' may be small. The light-emitting diode 300' of FIG. 16 has a small lattice constant difference between semiconductor layers in the manufacturing process so that crystal growth of the semiconductor material may be smoothly performed. Accordingly, in the light-emitting diode 300', a semiconductor layer that reduces a lattice constant, such as the third to fifth semiconductors 330, 340, and 350, may be omitted. However, the embodiment is not limited thereto, and the light-emitting diode 300' of FIG. 16 may further include a conductive semiconductor other than the first semiconductor 310' and the second semiconductor 320'.

Figure 17:
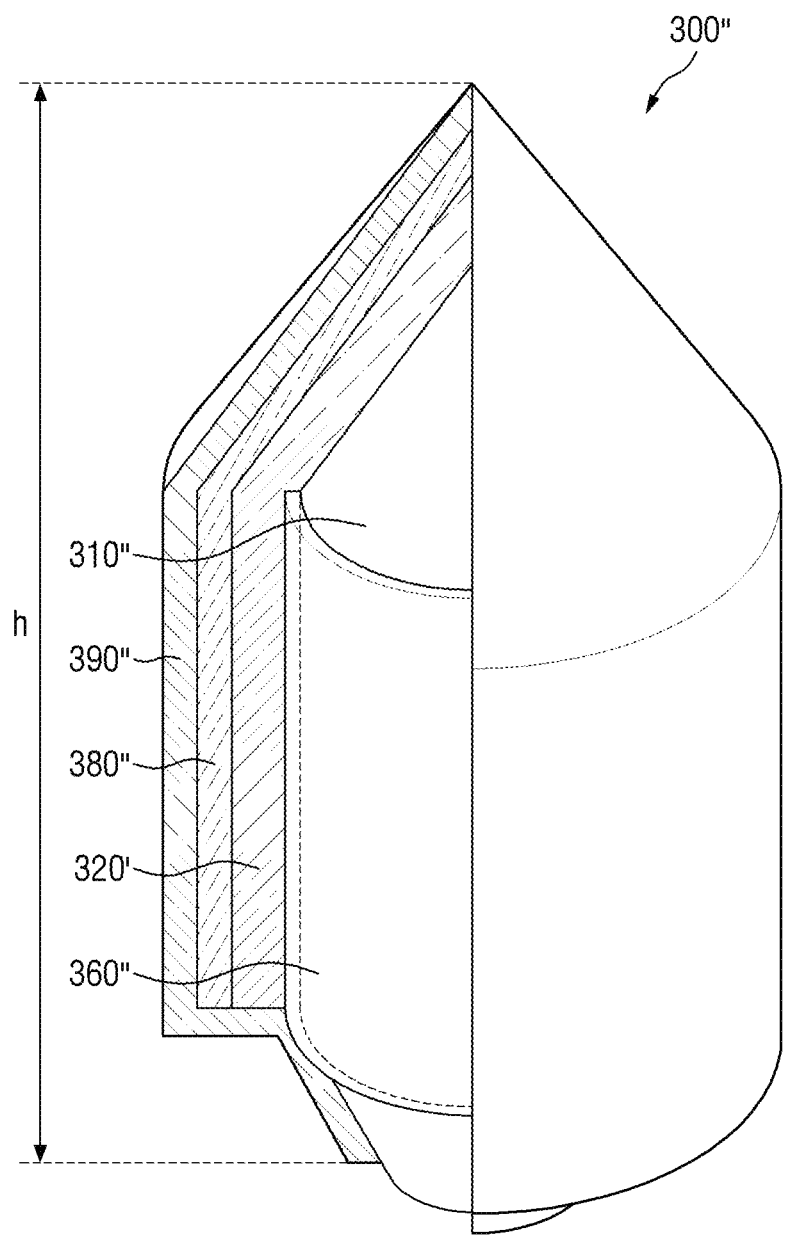
FIG. 17 is a schematic perspective view of a light-emitting diode according to another embodiment.

FIG. 17 is a schematic perspective view of a light-emitting diode according to an embodiment.

Referring to FIG. 17, in a light-emitting diode 300", layers are not stacked in a direction, and each layer may be formed to surround an outer surface of another layer. The light-emitting diode 300" of FIG. 17 is the same as the light-emitting diode 300' of FIG. 16, except that a shape of each layer is partially different. Hereinafter, repetitive contents will be omitted, and differences will be mainly described.

According to the embodiment, a first semiconductor 310" may extend in a direction, and both end portions thereof may be formed to be inclined toward a central portion thereof. The first semiconductor 310" of FIG. 17 may have a rod-shaped or cylindrical body portion and may have a shape in which a conical end portion is formed at each of an upper portion and a lower portion of the body portion. An upper end portion of the body portion may have a steeper inclination than a lower end portion thereof.

An active layer 360" is disposed to surround an outer surface of the body portion of the first semiconductor 310". The active layer 360" may have a ring shape extending in a direction. The active layer 360" is not formed on upper and lower end portions of the first semiconductor 310". For example, the active layer 360" may contact only a parallel side surface of the first semiconductor 310".

A second semiconductor 320" is disposed to surround an outer surface of the active layer 360" and the upper end portion of the first semiconductor 310". The second semiconductor 320" may include a ring-shaped body portion extending in a direction and an upper end portion formed so that a side surface is inclined. For example, the second semiconductor 320" may directly contact the parallel side surface of the active layer 360" and the inclined upper end portion of the first semiconductor 310". However, the second semiconductor 320" is not formed on the lower end portion of the first semiconductor 310".

A conductive electrode layer 380" is disposed to surround an outer surface of the second semiconductor 320". For example, the conductive electrode layer 380" and the second semiconductor 320" may have substantially the same shape. For example, the conductive electrode layer 380" may contact an entirety of the outer surface of the second semiconductor 320".

An insulating film 390" may be disposed to surround outer surfaces of the conductive electrode layer 380" and the first semiconductor 310". The insulating film 390" may directly contact the lower end portion of the first semiconductor 310" and exposed lower end portions of the active layer 360" and the second semiconductor 320" as well as the conductive electrode layer 380".

Figure 18:
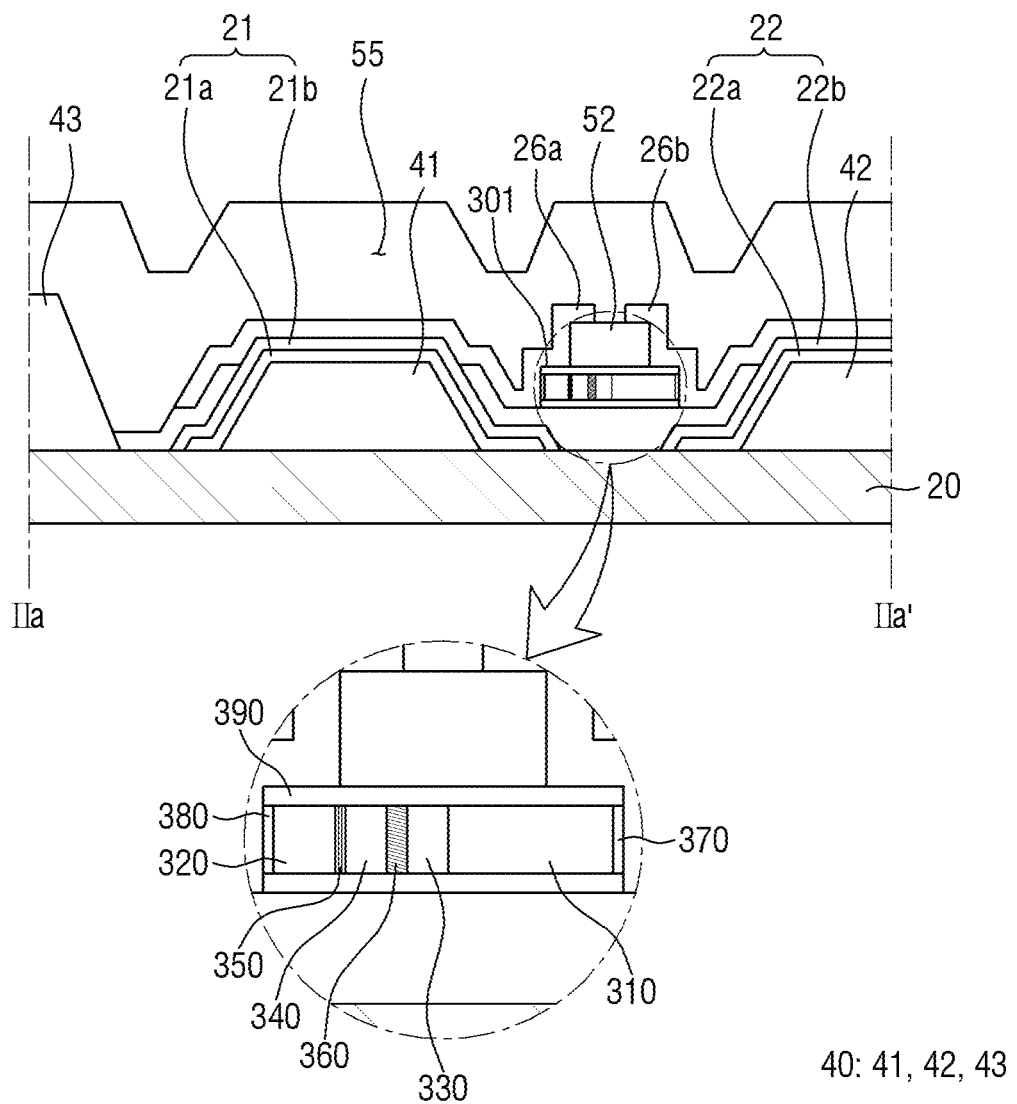
FIG. 18 is a partial cross-sectional view of the display device taken along line IIa-IIa' of FIG. 15.
Figure 19:
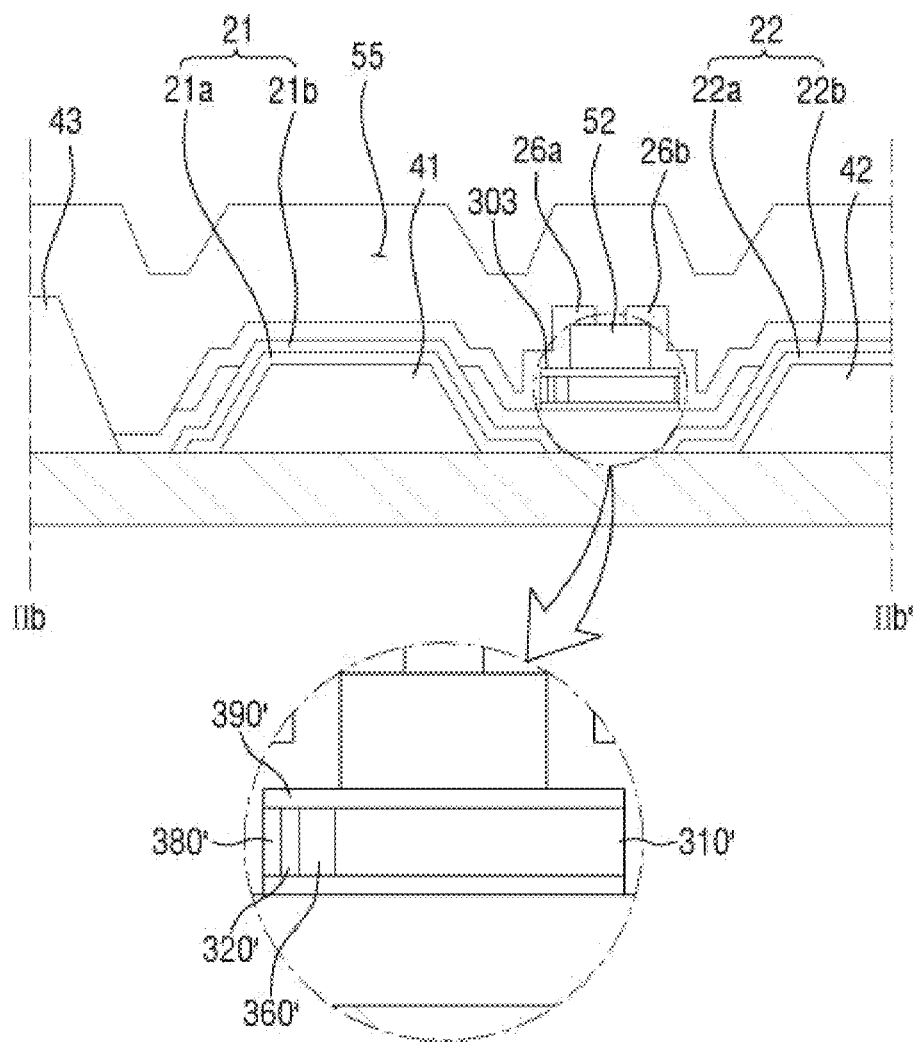
FIG. 19 is a partial cross-sectional view of the display device taken along line IIb-IIb' of FIG. 15.

FIG. 18 is a schematic partial cross-sectional view of the display device taken along line IIa-IIa' of FIG. 15. FIG. 19 is a schematic partial cross-sectional view of the display device taken along line IIb-IIb' of FIG. 15.

FIG. 18 illustrates a schematic cross-sectional view of the first sub-pixel PX1, and FIG. 19 illustrates a schematic cross-sectional view of the third sub-pixel PX3, but the same may be applied to other pixels PX or sub-pixels PXn. FIGS. 18 and 19 illustrate cross sections intersecting an end portion and another end portion of an arbitrary light-emitting diode 300.

Although not shown in FIGS. 18 and 19, the display device 1 may further include a circuit element layer positioned under each electrode 21 or 22. The circuit element layer may include semiconductor layers and conductive patterns to include at least one transistor and a power supply line. However, a detailed description thereof will be omitted below.

Referring to FIGS. 18 and 19, the display device 1 may include a via layer 20, the electrodes 21 and 22 disposed on the via layer 20, and the light-emitting diode 300. The circuit element layer (not shown) may be further disposed under the via layer 20. The via layer 20 may contain an organic insulating material to perform a function of surface planarization.

Banks 41, 42 and 43 are disposed on the via layer 20. The banks 41, 42 and 43 may be disposed to be spaced apart from each other in each sub-pixel PXn. The banks 41, 42 and 43 may include a first bank 41 and a second bank 42 disposed adjacent to a central portion of the sub-pixel PXn and a third bank 43 disposed at the boundary between the sub-pixels PXn.

In case that an ink I is sprayed using an inkjet printing device during manufacture of the display device 1, the third bank 43 may perform a function of blocking the ink I from overflowing into the boundary of the sub-pixel PXn. As another example, in case that the display device 1 further includes another member, the other member may be disposed on the third bank 43, and the third bank 43 may perform a function of supporting the member. However, the embodiment is not limited thereto.

The first bank 41 and the second bank 42 are spaced apart from each other and disposed to be opposite to each other. The first electrode 21 may be disposed on the first bank 41, and the second electrode 22 may be disposed on the second bank 42. In FIGS. 15, 18, and 19, it may be understood that the first electrode branch portion 21B is disposed on the first bank 41 and the second electrode branch portion 22B is disposed on the second bank 42.

As described above, the first bank 41, the second bank 42, and the third bank 43 may be formed by substantially a same process. Accordingly, the banks 41, 42, and 43 may form a single lattice pattern. The banks 41, 42, and 43 may include polyimide (PI).

The banks 41, 42, and 43 may have a structure in which at least a part thereof protrudes with respect to the via layer 20. The banks 41, 42, and 43 may protrude upward with respect to a plane on which the light-emitting diode 300 is disposed, and at least a part of the protruding portion may have an inclination. A shape of each of the banks 41, 42 and 43 having a protruding structure is not particularly limited. As shown in the drawing, the first bank 41 and the second bank 42 may protrude to a same height, and the third bank 43 may have a shape protruding to a higher position.

Reflective layers 21a and 22a may be disposed on the first and second banks 41 and 42, respectively, and electrode layers 21b and 22b may be disposed on the reflective layers 21a and 22a, respectively. The reflective layers 21a and 22a and the electrode layers 21b and 22b may form the electrodes 21 and 22, respectively.

The reflective layers 21a and 22a include a first reflective layer 21a and a second reflective layer 22a. The first reflective layer 21a may cover (or overlap) the first bank 41, and the second reflective layer 22a may cover the second bank 42. A part of the reflective layers 21a and 22a is electrically connected to the circuit element layer through a contact hole passing through the via layer 20.

The reflective layers 21a and 22a may contain a material having high reflectance to reflect light emitted from the light-emitting diode 300. As an example, the reflective layers 21a and 22a may contain a material such as silver (Ag), copper (Cu), indium tin oxide (ITO), indium zinc oxide (IZO), or indium tin-zinc oxide (ITZO), but the embodiment is not limited thereto.

The electrode layers 21b and 22b include a first electrode layer 21b and a second electrode layer 22b. The electrode layers 21b and 22b and the reflective layers 21a and 22a may have substantially the same pattern. The first reflective layer 21a and the first electrode layer 21b are disposed to be spaced apart from the second reflective layer 22a and the second electrode layer 22b, respectively.

The electrode layers 21b and 22b may contain a transparent conductive material so that the light emitted from the light-emitting diode 300 may be incident on the reflective layers 21a and 22a. As an example, the electrode layers 21b and 22b may contain a material such as indium tin oxide (ITO), indium zinc oxide (IZO), or indium tin-zinc oxide (ITZO), but the embodiment is not limited thereto.

In some embodiments, the reflective layers 21a and 22a and the electrode layers 21b and 22b may form a structure in which one or more transparent conductive layers such as an ITO, IZO, or ITZO layer and one or more metal layers such as a silver or copper layer are stacked. For example, the reflective layers 21a and 22a and the electrode layers 21b and 22b may form a stacked structure of ITO/silver (Ag)/ITO/IZO.

In some embodiments, the first electrode 21 and the second electrode 22 may be formed as one layer. For example, the reflective layers 21a and 22a and the electrode layers 21b and 22b may be formed as single layers to transmit an electrical signal to the light-emitting diode 300 and simultaneously reflect light. In an embodiment, the first electrode 21 and the second electrode 22 may include a conductive material having high reflectance. For example, the first electrode 21 and the second electrode 22 may be alloys containing aluminum (Al), nickel (Ni), lanthanum (La), and the like. However, the embodiment is not limited thereto.

The first insulating layer is disposed to partially cover the first electrode 21 and the second electrode 22. The first insulating layer is disposed to cover most of upper surfaces of the first electrode 21 and the second electrode 22 but may expose a part of the first electrode 21 and the second electrode 22. The first insulating layer may be disposed to partially cover (or overlap) a region in which the first electrode 21 and the second electrode 22 are separated, and an opposite side of the regions of the first electrode 21 and the second electrode 22.

The first insulating layer is disposed such that the relatively flat upper surfaces of the first electrode 21 and the second electrode 22 are exposed, and the electrodes 21 and 22 are disposed to overlap inclined side surfaces of the first bank 41 and the second bank 42. The first insulating layer forms a flat upper surface so that the light-emitting diode 300 is disposed thereon, and the upper surface extends in a direction toward the first electrode 21 and the second electrode 22. The extended portion of the first insulating layer terminates at the inclined side surfaces of the first electrode 21 and the second electrode 22. Accordingly, the contact electrode 26 may contact exposed portions of the first electrode 21 and the second electrode 22 and may smoothly contact the light-emitting diode 300 on the flat upper surface of the first insulating layer.

The first insulating layer may protect the first electrode 21 and the second electrode 22 and may insulate the first electrode 21 and the second electrode 22 from each other. It is possible to prevent the light-emitting diode 300 disposed on the first insulating layer from being damaged by directly contacting other members.

The light-emitting diode 300 may be disposed on the first insulating layer. At least one light-emitting diode 300 may be disposed on the first insulating layer between the first electrode 21 and the second electrode 22. Layers of the light-emitting diode 300 may be disposed in a horizontal direction on the via layer 20.

FIG. 18 illustrates the first light-emitting diode 301 disposed in the first sub pixel PX1, and FIG. 19 illustrates the third light-emitting diode 303 disposed in the third sub pixel PX3. The first light-emitting diode 301 of FIG. 18 is the light-emitting diode 300 of FIGS. 1 and 2 and may emit red light, and the third light-emitting diode 303 of FIG. 19 is the light-emitting diode 300' of FIG. 16 and may emit blue light.

The light-emitting diode 300 of the display device 1 according to an embodiment may include the conductive semiconductor and the active layer described above, which may be sequentially disposed in the horizontal direction on the via layer 20. As shown in the drawing, in the first light-emitting diode 301 of the first sub-pixel PX1, the first semiconductor 310, the third semiconductor 330, the active layer 360, the fourth semiconductor 340, the fifth semiconductor 350, the second semiconductor 320, and the conductive electrode layers 370 and 380 may be sequentially disposed in the horizontal direction on the via layer 20. In the third light-emitting diode 303 of the third sub-pixel PX3, the first semiconductor 310', the active layer 360', the second semiconductor 320', and the conductive electrode layer 380' may be sequentially disposed in the horizontal direction on the via layer 20. However, the embodiment is not limited thereto. An order in which the layers of the light-emitting diode 300 are disposed may be reverse, and in some embodiments, in case that the light-emitting diode 300 has a different structure, for example, in case that the light-emitting diode 300 is the light-emitting diode 300" in FIG. 17, the layers may be disposed in a direction perpendicular to the via layer 20.

The second insulating layer 52 may be partially disposed on the light-emitting diode 300. The second insulating layer 52 may protect the light-emitting diode 300 and may also perform a function of fixing the light-emitting diode 300 in the manufacturing process of the display device 1. The second insulating layer 52 may be disposed to surround an outer surface of the light-emitting diode 300. For example, some of the materials of the second insulating layer 52 may be disposed between a lower surface of the light-emitting diode 300 and the first insulating layer. The second insulating layer 52 may extend in the second direction D2 between the first electrode branch portion 21B and the second electrode branch portion 22B on a plane to have an island-like or linear shape.

The contact electrodes 26 are disposed on each of the electrodes 21 and 22 and the second insulating layer 52. The contact electrodes 26 include the first contact electrode 26a disposed on the first electrode 21 and the second contact electrode 26b disposed on the second electrode 22. The first contact electrode 26a and the second contact electrode 26b are spaced apart from each other on the second insulating layer 52. Accordingly, the second insulating layer 52 may insulate the first contact electrode 26a and the second contact electrode 26b from each other.

The first contact electrode 26a may contact at least the first electrode 21 exposed by patterning the first insulating layer and an end portion of the light-emitting diode 300. The second contact electrode 26b may contact at least the second electrode 22 exposed by patterning the first insulating layer and another end portion of the light-emitting diode 300. Each of the first and second contact electrodes 26a and 26b may contact side surfaces of both end portions of the light-emitting diode 300, for example, the first semiconductor 310, the second semiconductor 320, or the conductive electrode layer 370. As described above, the first insulating layer forms a flat upper surface so that the contact electrode 26 may smoothly contact side surfaces of the light-emitting diode 300.

The contact electrodes 26 may contain a conductive material. For example, the contact electrodes 26 may contain ITO, IZO, ITZO, aluminum (Al), or the like. However, the embodiment is not limited thereto.

The passivation layer 55 may be formed on the second insulating layer 52 and the contact electrodes 26 to function to protect members, disposed on the via layer 20, from the external environment.

Each of the first insulating layer, second insulating layer 52, and passivation layer 55 may contain an inorganic insulating material or an organic insulating material. In an embodiment, the first insulating layer and the passivation layer 55 may contain a material such as silicon oxide ($SiO_x$), silicon nitride ($SiN_x$), silicon oxynitride ($SiO_xN_y$), aluminum oxide ($Al_2O_3$), aluminum nitride (AlN), or the like. The second insulating layer 52 may contain a photoresist or the like as the organic insulating material. However, the embodiment is not limited thereto.

Hereinafter, an experimental example, in which the light-emitting diode 300 including the fifth semiconductor 350 according to an embodiment is manufactured, will be described.

Experimental Example

In Experimental Example, light-emitting diodes 300 including different fifth semiconductors 350 were manufactured, and their cross-sectional shapes were measured with a transmission electron microscope (TEM), and components forming the fifth semiconductor 350 were analyzed by an energy dispersive X-ray (EDX) analysis. Each of the light-emitting diodes 300 manufactured in the following Manufacturing Examples and Comparative Examples may include a semiconductor layer containing phosphorus (P) and may emit red light.

Manufacturing Example 1. Light-Emitting Diode Including ($Al_x$—$Ga_{1-x}$)InP Semiconductor Layers First, a semiconductor device including a first semiconductor 310 containing n-AlGaInP, a third semiconductor 330 containing n-AlInP, an active layer 360 containing AlGaInP and GaInP, a fourth semiconductor 340 containing p-AlInP, and a second semiconductor 320 containing p-GaP was manufactured.

The fifth semiconductor 350 was manufactured in a structure in which ($Al_{0.7}Ga_{0.3}$)InP/($Al_{0.5}Ga_{0.5}$)InP/($Al_{0.3}Ga_{0.7}$)InP were sequentially stacked between the fourth semiconductor 340 and the second semiconductor 320. For example, the fifth semiconductor 350 includes three sub-conductive semiconductors, each of which was manufactured as a semiconductor layer having x values of about 0.7, about 0.5, and about 0.3 in Chemical Formula 1. Each sub-semiconductor layer of the fifth semiconductor 350 contains each element in an atomic ratio of (Al—Ga)$_{0.25}$In$_{0.25}$P$_{0.5}$, and in Chemical Formula 1, the x value refers to a ratio between Al and Ga having a 0.25 atomic ratio with respect to the total atomic ratio. For example, it can be understood that the combined atomic ratio of Al and Ga includes 25% of the total atomic ratio of (Al—Ga)InP.

The semiconductor device that includes the conductive semiconductor and the active layer described above and emits red light is manufactured, and this is referred to as Manufacturing Example 1. A cross-sectional shape of the semiconductor device of Manufacturing Example 1 was measured using a transmission electron microscope (TEM), and atoms forming the fifth semiconductor 350 were analyzed by energy dispersion x-ray spectrometry (EDS) analysis. The TEM and EDS analysis results were shown in FIGS. 20, 23, and 26.

Comparative Example 1. Light-emitting diode including GaInP Semiconductor Layer

A light-emitting diode was manufactured in the same manner as Manufacturing Example 1 except that the fifth semiconductor 350 was manufactured as a $Ga_{0.65}In_{0.35}P$ semiconductor layer in Manufacturing Example 1, and this is referred to as Comparative Example 1. The light-emitting diode of Comparative Example 1 was subjected to the TEM and EDS analysis in the same manner as Manufacturing Example 1, and the results were shown in FIGS. 21, 24, and 27.

Comparative Example 2. Light-emitting diode including Single Layer of AlGaInP Semiconductor Layer A light-emitting diode was manufactured in the same manner as Manufacturing Example 1 except that the fifth semiconductor 350 included a sub-conductive semiconductor and the sub-conductive semiconductor was manufactured as an $(Al_{0.3}Ga_{0.7})InP$ semiconductor layer in Manufacturing Example 1, and this is referred to as Comparative Example 2. The light-emitting diode of Comparative Example 2 was subjected to the TEM and EDS analysis in the same manner as Manufacturing Example 1, and the results were shown in FIGS. 22, 25 and 28.

Figure 20:
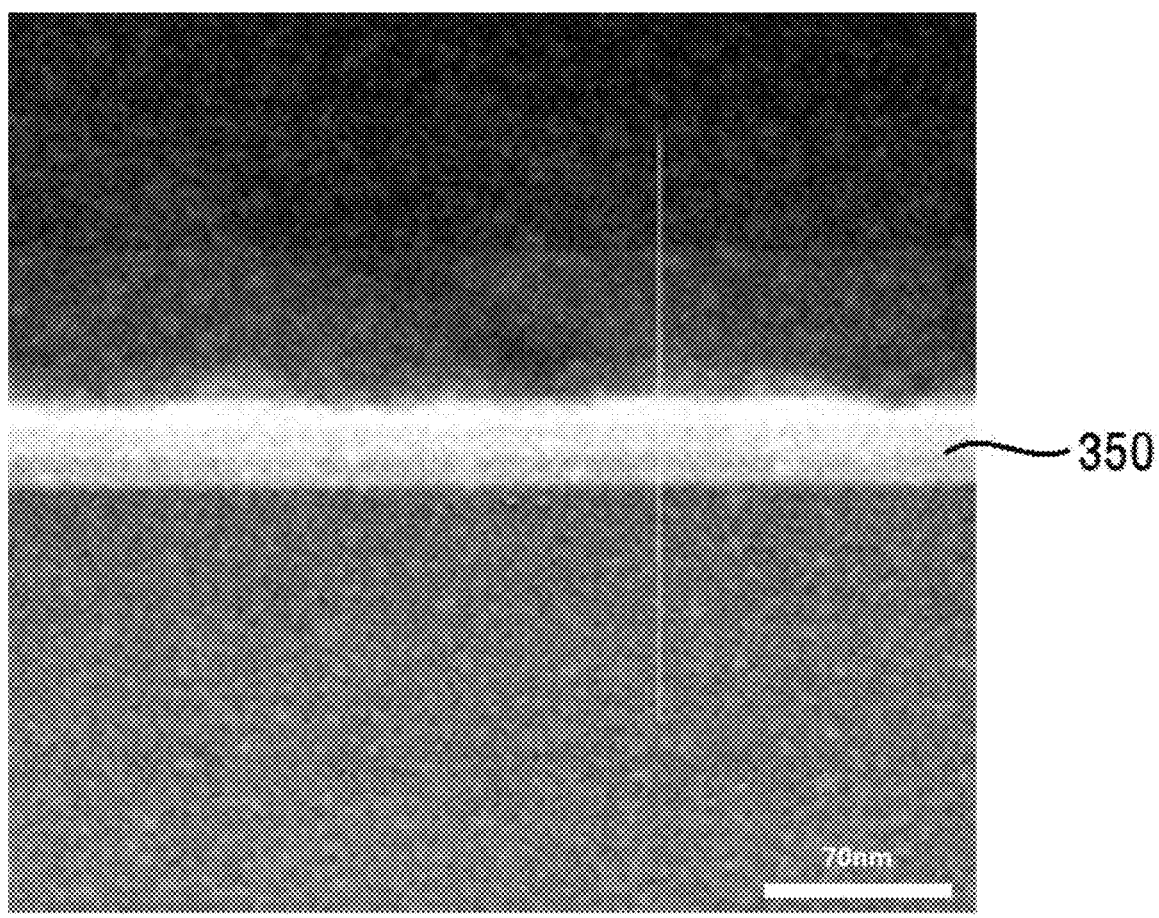
FIGS. 20 to 22 are transmission electron microscope (TEM) photographs showing fifth semiconductors of light-emitting diodes according to one Manufacturing Example and Comparative Example.
Figure 21:
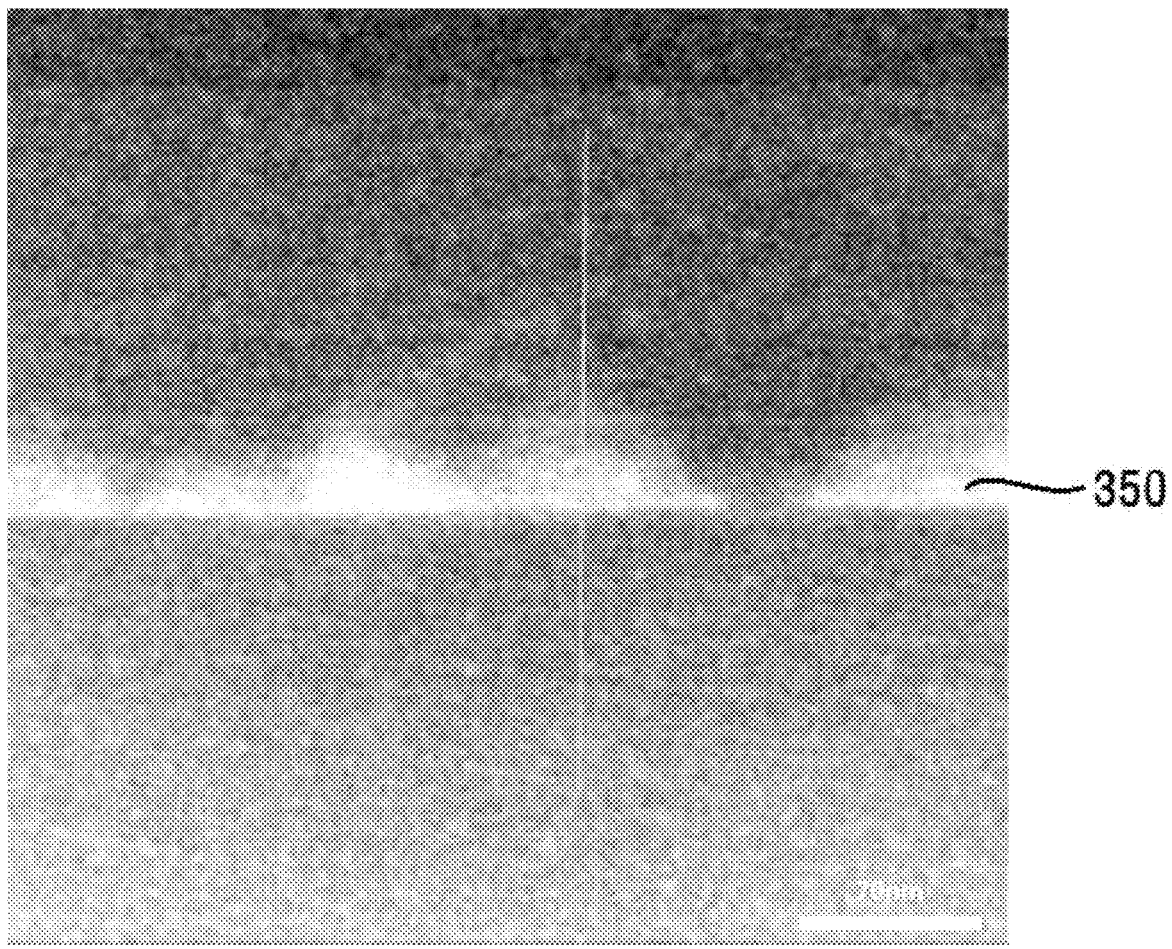
Figure 22:
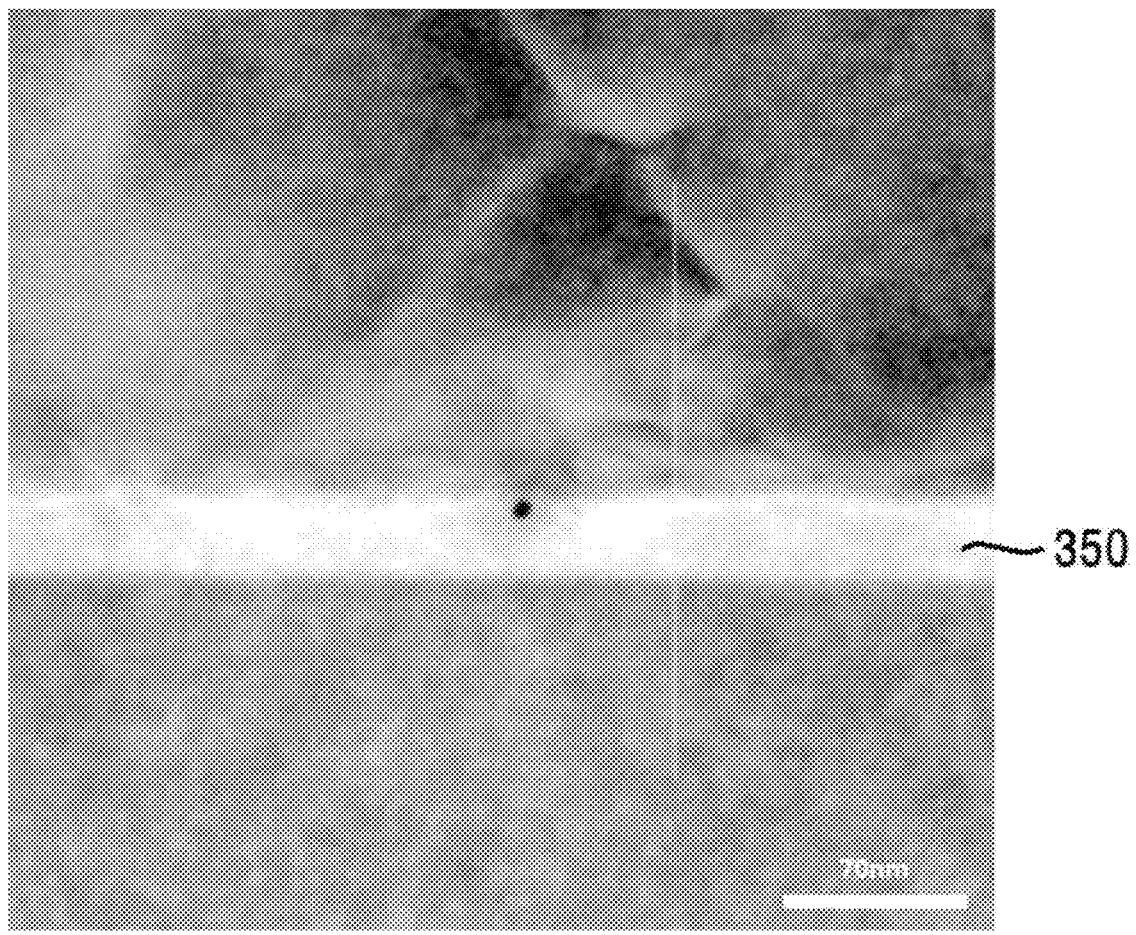
Figure 23:
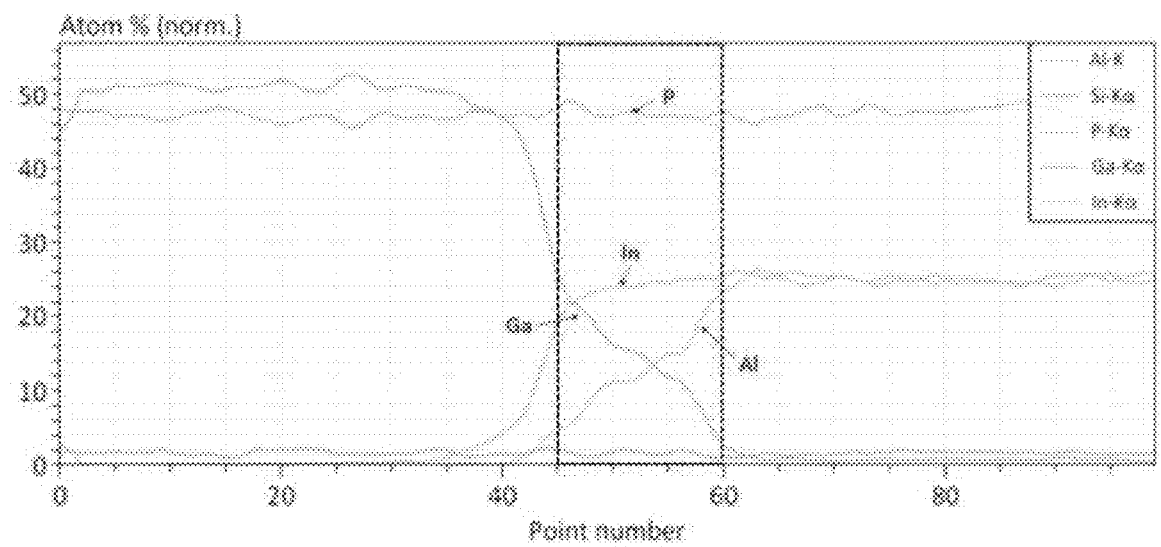
FIGS. 23 to 25 are energy dispersion x-ray spectrometry (EDS) graphs showing fifth semiconductors of light-emitting diodes according to one Manufacturing Example and Comparative Example.
Figure 23:
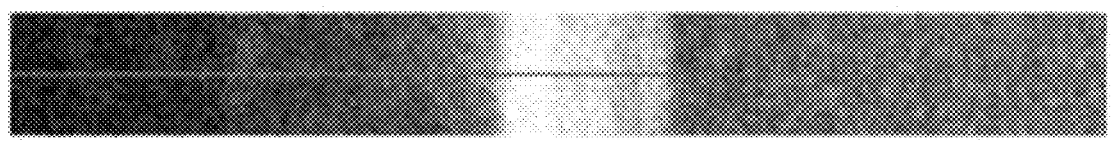
Figure 24:
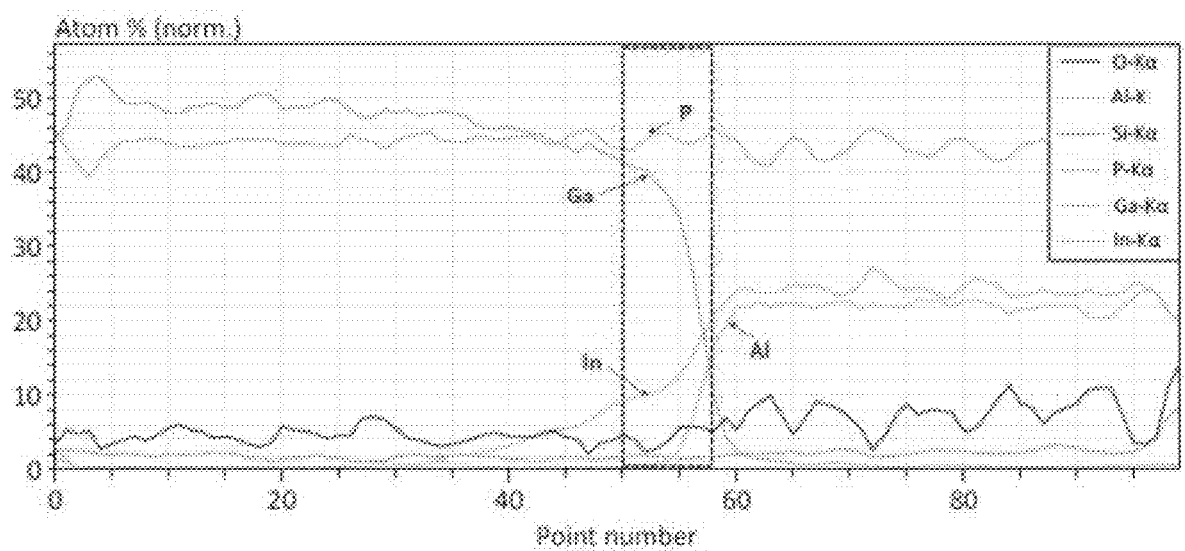
Figure 24:
Figure 25:
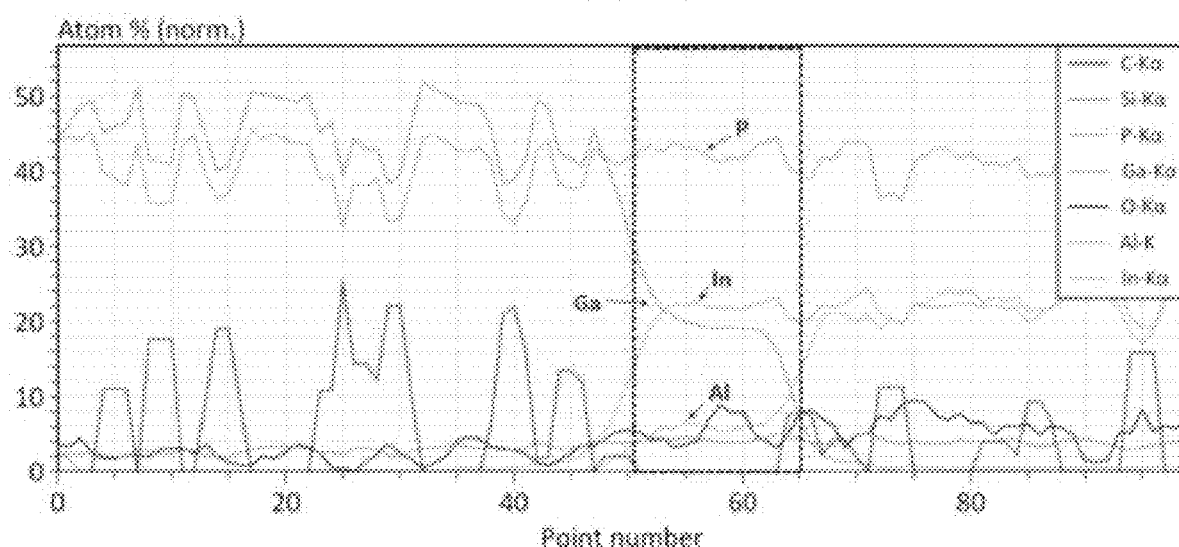
Figure 26:
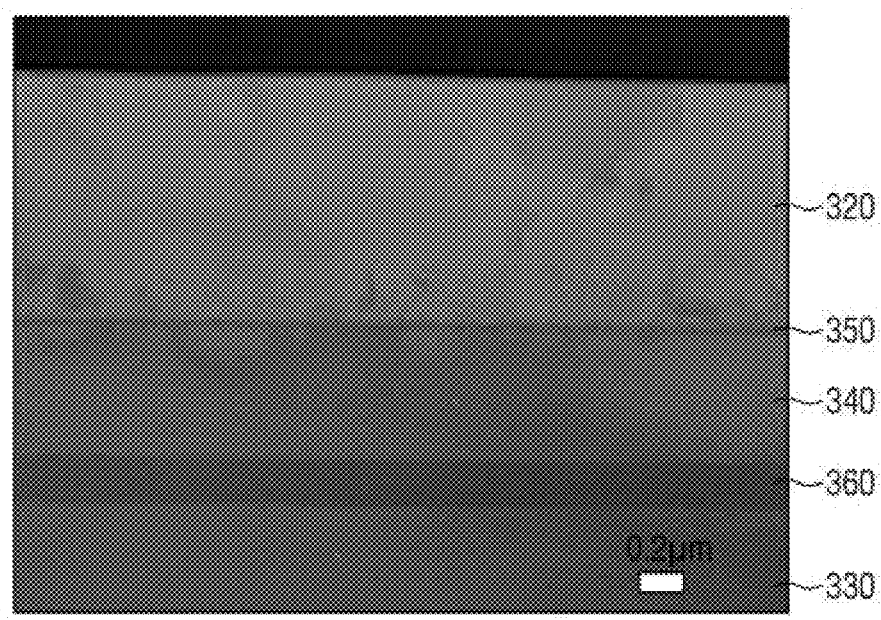
FIGS. 26 to 28 are transmission electron microscope (TEM) photographs showing cross-sections of light-emitting diodes according to one Manufacturing Example and Comparative Example.
Figure 27:
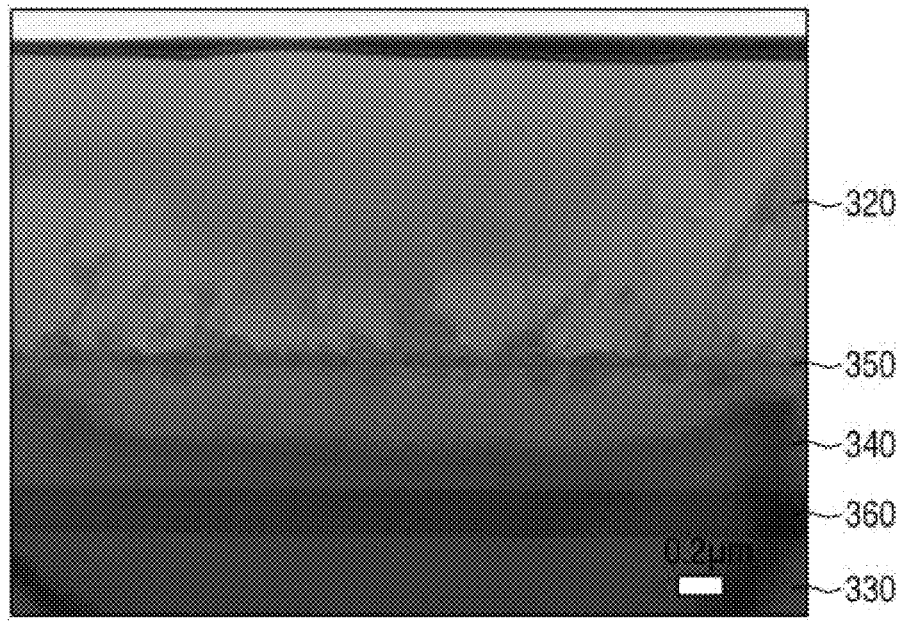
Figure 28:
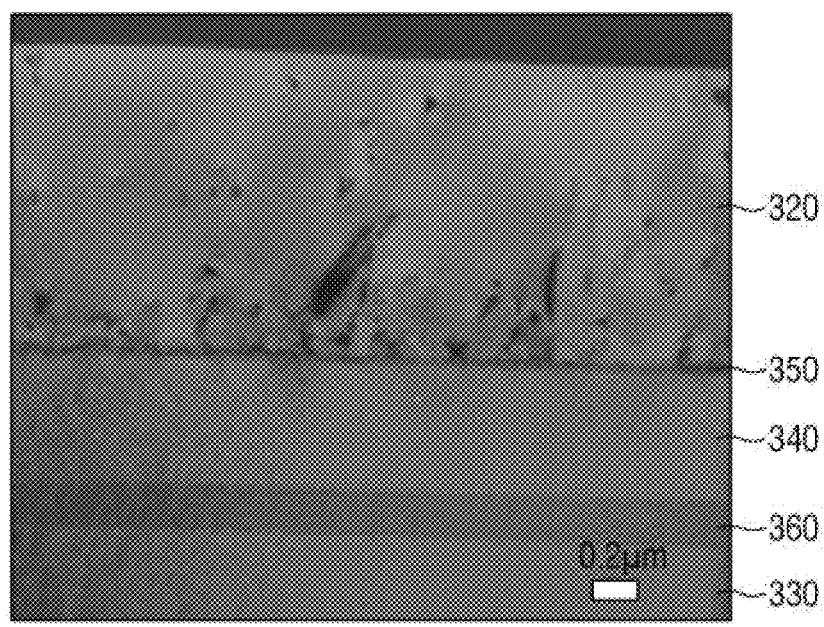

FIGS. 20 to 22 are transmission electron microscope (TEM) photographs showing fifth semiconductors of light-emitting diodes according to Manufacturing Example and Comparative Example. FIGS. 23 to 25 are energy dispersion x-ray spectrometry (EDS) graphs showing fifth semiconductors of light-emitting diodes according to one Manufacturing Example and Comparative Example. FIGS. 26 to 28 are transmission electron microscope (TEM) photographs showing cross-sections of light-emitting diodes according to one Manufacturing Example and Comparative Example.

First, referring to FIGS. 20 to 22, the semiconductor devices of Manufacturing Example 1, Comparative Example 1, and Comparative Example 2 each contain AlGaInP or GaInP as the fifth semiconductor 350, and it can be seen that the fifth semiconductors 350 may be grown on a fourth semiconductor containing p-AlInP. Referring to FIGS. 23 to 25, it can be seen that the semiconductor devices of Manufacturing Example 1, Comparative Example 1, and Comparative Example 2 each contain the fifth semiconductor 350 having a different atomic ratio. In particular, as shown in FIG. 20, referring to the EDS graph of Manufacturing Example 1, it can be seen that the fifth semiconductor 350 is manufactured as three semiconductor layers, for example, $(Al_{0.7}Ga_{0.3})InP/(Al_{0.5}Ga_{0.5})InP/(Al_{0.3}Ga_{0.7})InP$, and the content of aluminum (Al) and gallium (Ga) is different depending on a location. It can be seen that a sub-semiconductor layer adjacent to the fourth semiconductor has a higher content of aluminum (Al), and a sub-semiconductor layer adjacent to the second semiconductor has a higher content of gallium (Ga).

Referring to FIGS. 26 to 28, a surface shape of the second semiconductor grown on the fifth semiconductor 350 of each of the semiconductor devices of Manufacturing Example 1, Comparative Example 1, and Comparative Example 2 can be seen. As shown in FIG. 26, in the semiconductor device of Manufacturing Example 1, it can be seen that the p-GaP semiconductor layer of the second semiconductor was grown with a relatively uniform surface on an $(Al_{0.7}Ga_{0.3})InP/(Al_{0.5}Ga_{0.5})InP/(Al_{0.3}Ga_{0.7})InP$ layer. In the $(Al_{0.7}Ga_{0.3})InP/(Al_{0.5}Ga_{0.5})InP/(Al_{0.3}Ga_{0.7})InP$ layer, it can be seen that the p-GaP layer was smoothly grown by reducing a lattice constant difference between the p-AlInP layer as the fourth semiconductor and the p-GaP layer as the second semiconductor.

On the other hand, as shown in FIGS. 27 and 28, in case that the fifth semiconductor is a $Ga_{0.65}In_{0.35}P$ layer (Comparative Example 1, see FIG. 27) or a single $(Al_{0.3}Ga_{0.7})InP$ layer (Comparative Example 2, see FIG. 28), it can be seen that the surface of the p-GaP layer, which is the second semiconductor, is not smooth and has cracks therein, compared to FIG. 26. This means that in the case of Comparative Example 1 and Comparative Example 2, there was a lattice constant difference between p-AlInP and p-GaP such that the growth of the p-GaP layer was not smooth. For example, as in Manufacturing Example 1, in the light-emitting diode according to an embodiment, the fifth semiconductor includes sub-semiconductor layers having different contents of Al and Ga, and thus a lattice constant difference between the fourth semiconductor and the second semiconductor may be reduced, and the crystal quality of the second semiconductor may be improved.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

The invention claimed is:
1. A light-emitting diode comprising:
a first semiconductor region having a first conductive type;
a second semiconductor region having a second conductive type; and
an active layer disposed between the first semiconductor region and the second semiconductor region and including phosphorus (P), wherein
the light-emitting diode has a rod shape,
the second semiconductor region includes a first semiconductor layer, a second semiconductor layer, and a third semiconductor layer which are sequentially stacked,
the first semiconductor layer is disposed between the active layer and the second semiconductor layer, and
the second semiconductor layer includes a compound represented by Chemical Formula 1 and satisfying Equation 1,

AlGaInP,                                     Chemical Formula 1

Equation 1:
$1/9 \leq M \leq 9$, wherein M refers to a content of aluminum (Al) with respect to a content of gallium (Ga) included in AlGaInP (i.e., the content of aluminum (Al) in AlGaInP (at. %)/the content of gallium (Ga) in AlGaInP (at. %)).

2. The light-emitting diode of claim 1, wherein
the second semiconductor layer includes a first sub-semiconductor layer and a second sub-semiconductor layer disposed on the first sub-semiconductor layer, and
M1 which is an M value of the first sub-semiconductor layer is greater than M2 which is an M value of the second sub-semiconductor layer.

3. The light-emitting diode of claim 2, wherein a lattice constant of the first sub-semiconductor layer is greater than a lattice constant of the second sub-semiconductor layer.

4. The light-emitting diode of claim 3, wherein the first sub-semiconductor layer and the second sub-semiconductor layer each have a lattice constant in a range of about 5.45 Å to about 5.65 Å.

5. The light-emitting diode of claim 2, wherein
the second semiconductor layer includes a third sub-semiconductor layer disposed on the second sub-semiconductor layer and having an M value in Equation 1 equal to M3, and
a difference between M1 and M2 is equal to a difference between M2 and M3.

6. The light-emitting diode of claim 5, wherein the difference between M1 and M2 is in a range of about 0.2 to about 0.4.

7. The light-emitting diode of claim 2, wherein M values in the second semiconductor layer decrease from a surface contacting the first semiconductor layer toward another surface contacting the third semiconductor layer.

8. The light-emitting diode of claim 2, wherein
a length measured in a first direction, in which the first semiconductor region, the active layer, and the second semiconductor region are disposed, is in a range of about 3 μm to about 5 μm in the light-emitting diode, and
a length measured in the first direction is in a range of about 10 nm to about 30 nm in the second semiconductor layer.

9. The light-emitting diode of claim 8, wherein a length measured in the first direction is in a range of about 5 nm to about 10 nm in each of the first sub-semiconductor layer and the second sub-semiconductor layer.

10. The light-emitting diode of claim 9, wherein the active layer includes AlInP and AlGaInP and emits light having a center wavelength band in a range of about 500 nm to about 640 nm.

11. The light-emitting diode of claim 10, wherein the second semiconductor layer has a band gap energy in a range of about 2.0 eV to about 2.33 eV.

12. The light-emitting diode of claim 1, wherein
the first conductive type is an n-type, and
the second conductive type is a p-type.

13. The light-emitting diode of claim 12, further comprising,
an insulating film surrounding at least an outer surface of the active layer,
wherein the insulating film extends in a direction in which the first semiconductor region and the second semiconductor region are disposed.

14. The light-emitting diode of claim 13, comprising:
a first electrode layer disposed on a surface of the first semiconductor region other than a surface of the first semiconductor region on which the active layer is disposed; and
a second electrode layer disposed on the second semiconductor region.

15. A display device comprising:
a base layer;
a first electrode and a second electrode disposed on the base layer; and
at least one first light-emitting diode disposed between the first electrode and the second electrode, wherein
the at least one first light-emitting diode includes:
a first semiconductor region having a first conductive type;
a second semiconductor region having a second conductive type; and
a first active layer disposed between the first semiconductor region and the second semiconductor region and including phosphorus (P),
the second semiconductor region includes a first semiconductor layer, a second semiconductor layer, and a third semiconductor layer, which are sequentially stacked,
the first semiconductor layer is disposed between the active layer and the second semiconductor layer, and
the second semiconductor layer includes a compound represented by Chemical Formula 1 and satisfying Equation 1, AlGaInP,      Chemical Formula 1:

,      Equation 1 wherein M refers to a content of aluminum (Al) with respect to a content of gallium (Ga) included in AlGaInP (i.e., the content of aluminum (Al) in AlGaInP (at. %)/the content of gallium (Ga) in AlGaInP (at. %)).

16. The display device of claim 15, wherein
the second semiconductor layer includes:
a first sub-semiconductor layer; and
a second sub-semiconductor layer disposed on the first sub-semiconductor layer, and
an M value of the first sub-semiconductor layer is greater than an M value of the second sub-semiconductor layer.

17. The display device of claim 16, wherein a lattice constant of the first sub-semiconductor layer is greater than a lattice constant of the second sub-semiconductor layer.

18. The display device of claim 15, further comprising:
a third electrode and a fourth electrode disposed on the base layer; and
at least one second light-emitting diode disposed between the third electrode and the fourth electrode,
wherein the second light-emitting diode includes a second active layer including nitrogen (N).

19. The display device of claim 18, wherein
the at least one first light-emitting diode emits a first light having a center wavelength band in a range of about 500 nm to about 640 nm, and
the second light-emitting diode emits a second light having a center wavelength band in a range of about 400 nm to about 450 nm.

20. The display device of claim 19, wherein
end portions of the at least one first light-emitting diode are electrically connected to the first electrode and the second electrode, respectively, and
end portions of the second light-emitting diode are electrically connected to the third electrode and the fourth electrode, respectively.

* * * * *